United States Patent
Kiuchi et al.

[11] Patent Number: 6,132,875
[45] Date of Patent: *Oct. 17, 2000

[54] MAGNETIC RECORDING MEDIUM AND MAGNETIC HEAD HAVING CARBON PROTECTIVE LAYERS

[75] Inventors: Katsumi Kiuchi; Eishin Yamakawa; Yoshito Kitamoto; Makoto Watanabe; Masahiro Takagi, all of Kawasaki; Akira Kikuchi, Higashine, all of Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/724,323

[22] Filed: Oct. 1, 1996

Related U.S. Application Data

[63] Continuation of application No. 08/304,529, Sep. 12, 1994, abandoned.

[30] Foreign Application Priority Data

| Sep. 12, 1993 | [JP] | Japan | 5-251115 |
| Sep. 12, 1993 | [JP] | Japan | 5-278937 |
| May 29, 1994 | [JP] | Japan | 6-139501 |

[51] Int. Cl.$^7$ .................................. G11B 05/72
[52] U.S. Cl. .................................. 428/408; 428/694 TC; 428/694 TF; 428/900; 360/103; 360/122
[58] Field of Search .................. 428/408, 694 R, 428/694 TC, 694 TF, 900; 360/122, 103

[56] References Cited

U.S. PATENT DOCUMENTS

| 4,717,622 | 1/1988 | Kurokawa et al. | 428/408 |
| 4,778,582 | 10/1988 | Howard | 204/192.15 |
| 4,804,590 | 2/1989 | Nakamura et al. | 428/408 |
| 4,877,677 | 10/1989 | Hirochi et al. | 428/216 |
| 4,960,609 | 10/1990 | Homala et al. | 427/38 |
| 5,030,478 | 7/1991 | Lin et al. | 427/54.1 |
| 5,614,314 | 3/1997 | Itoh et al. | 428/332 |

FOREIGN PATENT DOCUMENTS

| 0248556 | 12/1987 | European Pat. Off. |
| 0249216 | 12/1987 | European Pat. Off. |
| 61-210518 | 9/1986 | Japan |
| 62-114124 | 5/1987 | Japan |
| 63-162872 | 7/1988 | Japan |
| 63-311626 | 12/1988 | Japan |
| 1-201819 | 8/1989 | Japan |

(List continued on next page.)

OTHER PUBLICATIONS

Saperstein et al "Improved Adhesion and Coverage of Perflurs–Polymer Lubricants Following Far–UV Irrodiation" *Laugnuir*, 6, 1522–1524 (1990).

Ishikawa et al "Dual–Carbon A New Surfacce Protective Film For Thin Film Hard Disks" IEEE Trans On Magnetics vol. Mag 22#5, Sep. 1986.

*Primary Examiner*—Stevan A. Resan
*Attorney, Agent, or Firm*—Greer, Burns & Crain, Ltd.

[57] ABSTRACT

In a magnetic recording medium wherein a magnetic recording layer for storing information, a carbon type protective layer for preventing damage of the magnetic recording layer and a lubrication layer are sequentially formed on a non-magnetic substrate, the carbon protective layer has a relatively smaller hydrogen content on the side nearer the lubrication layer than on the side nearer the magnetic recording layer. In a magnetic head slider having an electromagnetic conversion device mounted thereto, a carbon protective layer is laminated on at least a sliding surface side, and a lubrication layer is disposed on the carbon type protective layer. In a recording apparatus including a recording medium for storing information and a magnetic head for recording or reproducing information to and from the memory medium, a carbon protective film having a lower hydrogen content at an upper, surface portion thereof than at a lower, initial portion thereof is formed on either the recording medium or a sliding portion of the magnetic head.

4 Claims, 25 Drawing Sheets

FOREIGN PATENT DOCUMENTS

| | | |
|---|---|---|
| 63-23734 | 8/1989 | Japan . |
| 1-258218 | 10/1989 | Japan . |
| 1258218 | 10/1989 | Japan . |
| 1258219 | 10/1989 | Japan . |
| 1258220 | 10/1989 | Japan . |
| 2 71422 | 3/1990 | Japan . |
| 2087322 | 3/1990 | Japan . |
| 2161612 | 6/1990 | Japan . |
| 4182916 | 6/1992 | Japan . |
| 5-166174 | 7/1993 | Japan . |

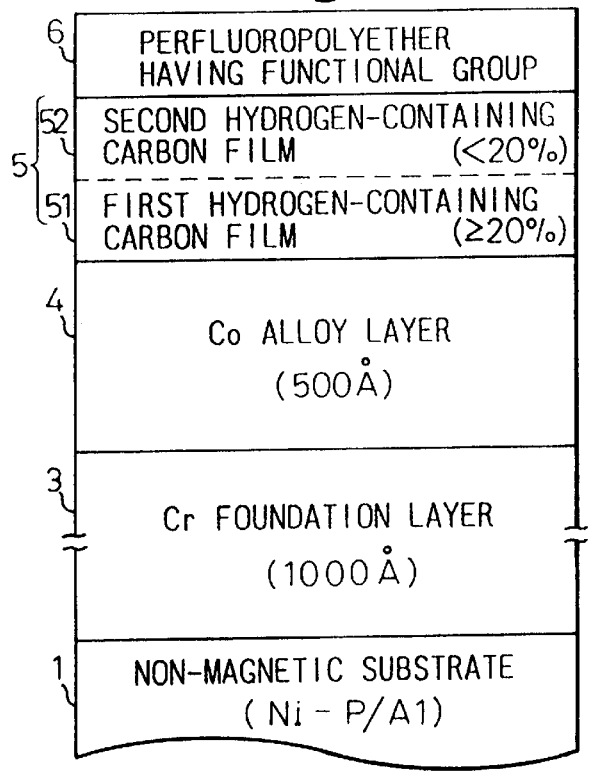
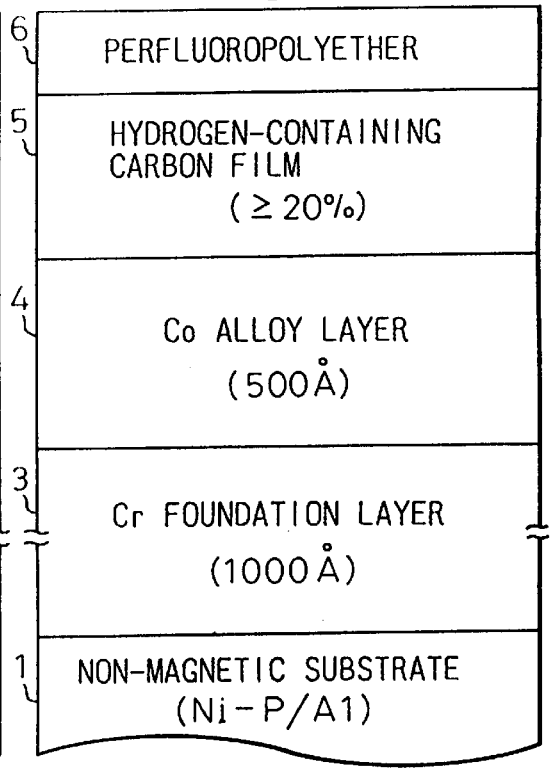
Fig. 2
| HYDROGEN CONTENT | C-H Q'TY(cm$^{-3}$) | AM3001 THICKNESS INITIAL | AFTER SOLVENT RINSING |
|---|---|---|---|
| 16 % | 0.34 × 10$^{22}$ | 25Å | 10Å |
| 33 % | 0.47 × 10$^{22}$ | 25Å | 5Å |
| 52 % | 1.45 × 10$^{22}$ | 25Å | 5Å |
| 54 % | 2.67 × 10$^{22}$ | 25Å | 5Å |

Fig. 7

| HYDROGEN CONTENT | UV IRRADIATION | AM3001 THICKNESS | | RATIO |
|---|---|---|---|---|
| | | INITIAL | AFTER SOLVENT RINSING | |
| 16%<br>C-H Q'TY<br>$0.34 \times 10^{22}$ | NIL | 25Å | 10Å | 40% |
| | 30SEC | 25Å | 14Å | 56% |
| | 60SEC | 25Å | 21Å | 84% |
| 33%<br>C-H Q'TY<br>$0.47 \times 10^{22}$ | NIL | 25Å | 5Å | 20% |
| | 30SEC | 25Å | 11Å | 44% |
| | 60SEC | 25Å | 18Å | 72% |

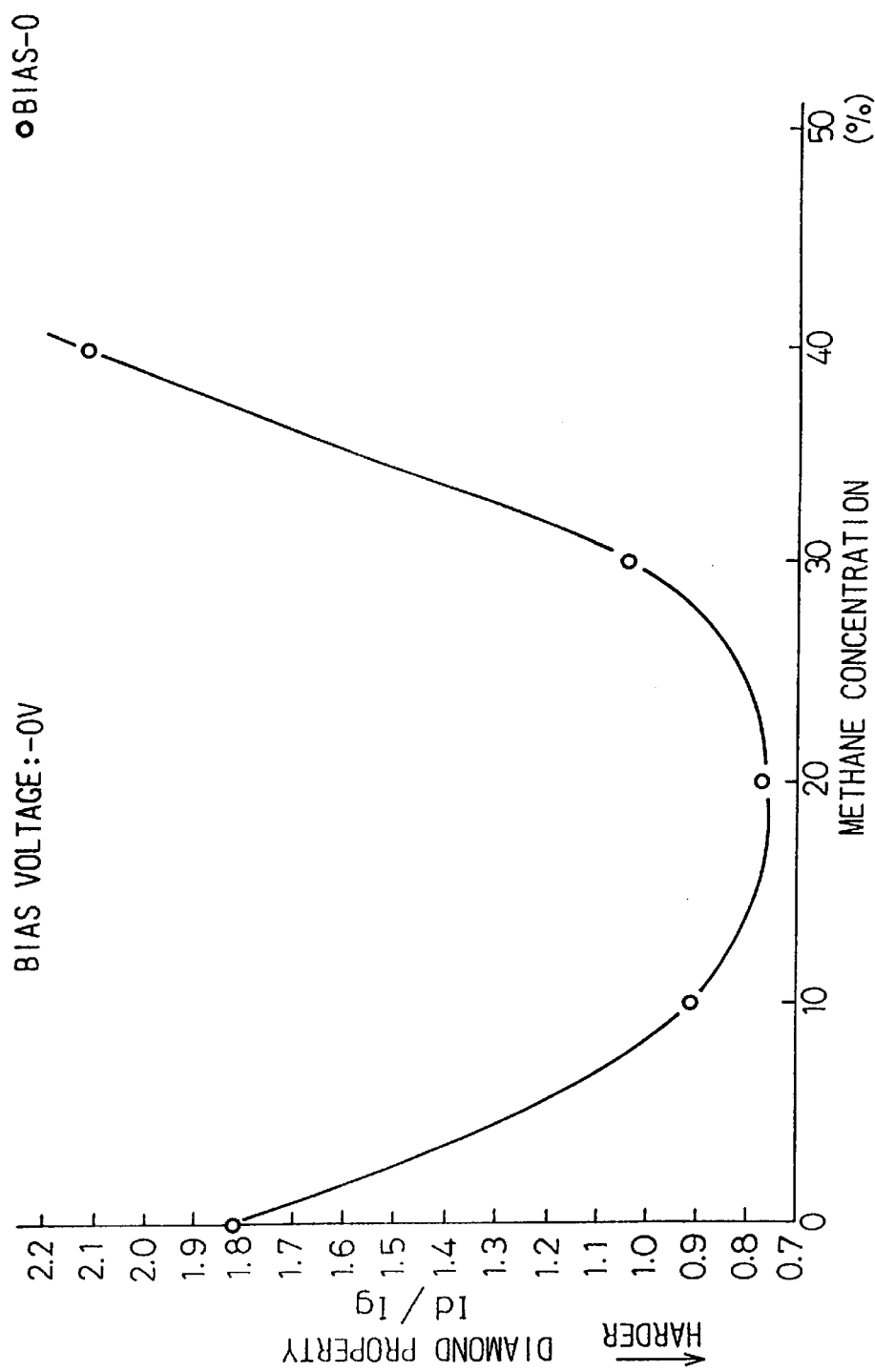

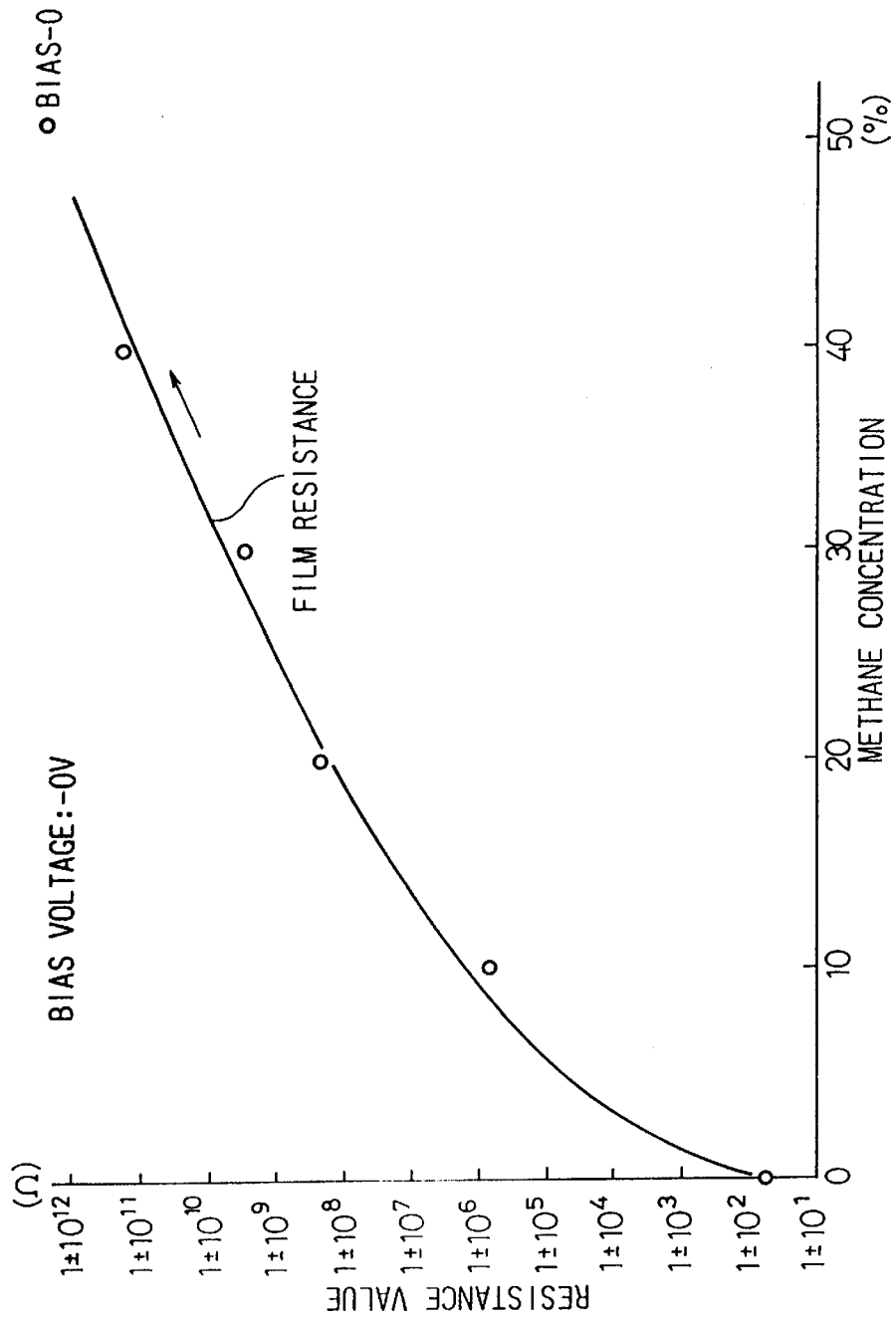

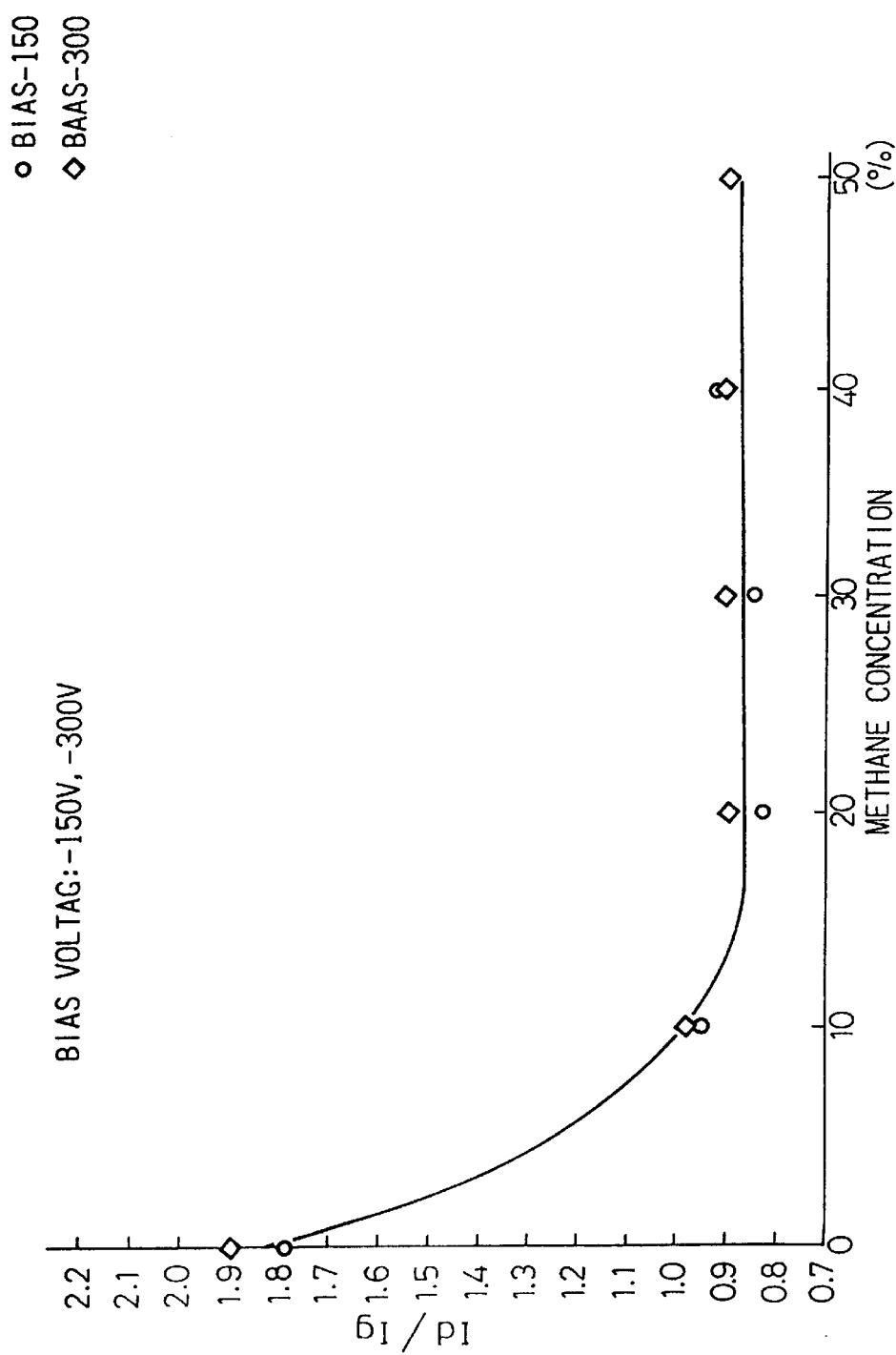

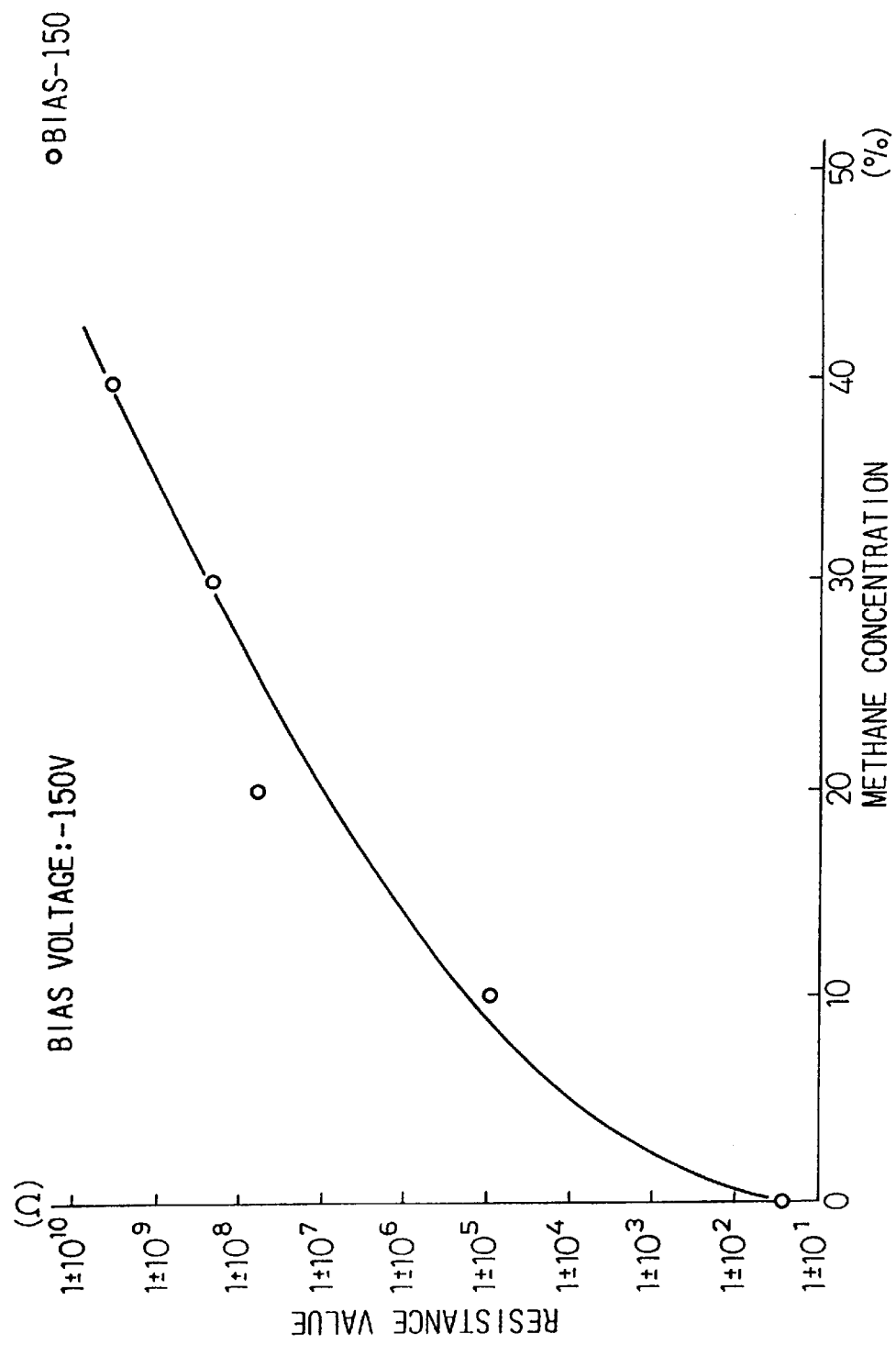

MAGNETIC RECORDING MEDIUM AND MAGNETIC HEAD HAVING CARBON PROTECTIVE LAYERS

RELATED APPLICATION

This is a continuation of application Ser. No. 08/304,529, filed on Sep. 12, 1994 now abandoned.

BACKGROUND OF THE INVENTION

1. Field of the Invention

This invention relates to a magnetic recording medium, a magnetic head and a magnetic recording apparatus. More particularly, the present invention relates to a carbon protective film used on a sliding surface of a magnetic recording medium on a magnetic head in a magnetic dick apparatus, a floppy disk apparatus, a magnetic tape apparatus, and so forth.

2. Description of the Related Art

Recently, higher recording densities and greater capacities have been required for magnetic disk device. To promote these higher densities and capacities, the performance of the head and the medium must be improved and the floating gap between the head and the medium reduced. As a matter of fact, manufacturers have attempted to use a novel magneto-resistive head to the head/medium system and a novel head/medium system for vertical recording. On the other hand, the floating distance between the head and the medium has been reduced to about 0.1 $\mu$m.

With the recent demands for greater capacity in a magnetic disk apparatus and for smaller size, a magnetic head utilizing an MR device (or an MR head) has been developed. To allow a current to flow directly through the device, the MR head needs an insulating protective film on its sliding surface. As to a protective film on the magnetic disk, a protective film having excellent insulating property is similarly required.

Further, because an improvement in the reliability of the magnetic disk apparatus was required, magnetic disks and a magnetic heads which are highly resistant to head crushes and have high durability are required, and a protective film having high hardness, such as a hydrogen-containing carbon film, has now been developed.

FIG. 28 is a plan view showing the internal structure of a magnetic disk apparatus. While a magnetic disk M is rotating at a high speed, a magnetic head h moves in a substantially radial direction to execute a seek operation, and recording/reproduction of information can then be carried out.

FIG. 29 is an enlarged sectional view of the magnetic disk M cut at the position of the magnetic head h and enlarged. In the thin film type magnetic disk M, reference numeral 1 denotes a substrate made of a non-magnetic substance such as aluminum or glass. While a NiP plating layer 2 is formed on the surface of the substrate so as to improve a mechanical strength, a Cr foundation layer 3 is formed to a film thickness of about 1,000 Å by sputtering so as to improve horizontal orientation of the Co alloy.

After a thin film magnetic film 4 is formed by sputtering a magnetic material such as CoCrTa or CoNiCr to a thickness of about 500 Å, carbon is sputtered to a thickness of about 300 Å as a protective film 5. Finally, a fluorine type lubrication layer 6 such as a perfluoropolyether is coated to some dozens of angstroms (Å) and the product is completed.

When this magnetic disk M is rotated at a high speed in a direction represented by an arrow $a_1$, the magnetic head slider 7 flies, at a very small height in an air stream flowing past an inflow slope S, so that recording and reproduction of information can be made to and from the magnetic film 4 of the magnetic disk by the electromagnetic conversion device 8 which is in a non-sliding condition.

The slider 7 of the magnetic head is fitted to a spring arm 11 through a gimbal 10, and a seek operation is carried out by a driving arm 13 on a carriage 12. Due to the simplicity of the mechanism as described above, a CSS (Contact Start Stop) system, wherein a core slider slides on the lubrication layer 6 at the starting and stopping of the apparatus, has been widely used.

FIGS. 30A to 30F are sectional views showing, step-wise, a production method for a thin film type magnetic disk according to the prior art, and this method is also described in Japanese Patent Application No. 3-336459 previously filed by the Applicant of the present invention. At the step shown in FIG. 30A, reference numeral 1 denotes a doughnut-like substrate made of a non-magnetic substance such as aluminum. This substrate is shaped into the same size as that of the magnetic disk which is to be fabricated. When a small diameter magnetic disk of 2.5 in. is to be produced, for example, a non-magnetic disk 1 having a diameter of 2.5 in. is used.

At the step shown in FIG. 30B, a NiP plating foundation layer 2 is formed on both surfaces of the non-magnetic disk 1, and fine texture grooves 8 are formed in a circumferential direction by pushing an abrasive tape to the sheet surfaces of the rotating non-magnetic substrate as shown in FIG. 30C.

At the next step shown in FIG. 30D, a Cr foundation layer 3 is formed, to a thickness of about 1,000 Å, on the texture groove 8 so as to improve the horizontal orientation of the Co alloy, and a magnetic film 4, consisting of a Co alloy, for example, is formed to a thickness of about 500 Å on the Cr foundation layer 3 as shown in FIG. 30E. A hydrogen-containing carbon film 5 is formed, as a protective film, to a thickness of about 300 Å on the magnetic film 4 as shown in FIG. 30F, and finally, a fluorine type lubrication layer 6 is coated on the carbon film 5. The Cr layer 3, the thin film type magnetic film 4 and the carbon film 5 are formed by a thin film formation technology such as sputtering.

The texture groove 8 formed at the step shown in FIG. 30C is formed in order to provide magnetic anisotropy so that electromagnetic conversion characteristics can be improved at the time of recording and reproduction of information.

Because the carbon film 5, too, is affected by the texture groove 8, the lubricant can prevent the magnetic head from being adsorbed to the magnetic disk surface, and the friction between the magnetic head and the magnetic head surface can be reduced.

As the floating distance between the head and the medium has been reduced in recent types of heads, the probability that the head comes into contact with the medium has increased. Accordingly, in order to produce such a head and a medium, development of a protection and lubrication treatment which is more durable has become indispensable.

To improve the durability of the treatment, various methods have been proposed in the past, such as a method which forms an amorphous carbon film by sputtering, a method which introduces hydrogen into a carbon film and converts the film structure to a diamond-like structure so as to improve mechanical characteristics by improving a film hardness and impact resistance, a method which applies a perfluoropolyether having a functional group with a foundation layer, as a lubricant, and so forth, and some of these methods have already been put into practical use.

As described above, it has been confirmed that the application of the hydrogen-containing film is effective for improving the mechanical characteristics. As a result of intensive studies, however, the inventors of the present invention have found out that when a hydrogen content exceeding a specific quantity is used, the adhesion strength with the lubricant drops. The drop in the adhesion strength between the protective film and the lubricant invites problems in the CSS (Contact Start Stop) system and in a high-speed magnetic disk apparatus in that film decrease of the lubrication layer becomes remarkable, and that the durability as well as the reliability drop.

The magnetic head shown in FIG. 29 is of a monolithic type, whereas the head shown in FIG. 13 is thin film magnetic head. A head device portion 14 is formed, using a thin film technique, and is covered with a protective film such as $Al_2O_3$. A slider 7 has float rails 15, 16 on both sides of the slide surface, and inflow slopes 15s, 16s, for taking in an air stream, are defined on the opposite side to the head device portion 14.

FIGS. 14, 15A and 15B are schematic views useful for explaining a method of mass-producing the thin film magnetic head typically illustrated in FIG. 13. FIG. 14 shows a method of forming a large number of head device portions in a matrix form on a substrate, and FIGS. 15A and 15B illustrate a method which separates and finishes, one by one, the slides from a line in a slider block.

As shown in FIG. 14, a large number of head device portions 14 are first formed on a substrate 7W made of ferrite or $Al_2O_3$Tic by thin film technology, and are then separated, one by one, from the positions by cut lines 18, 19. In this way, the thin film magnetic head shown in FIG. 13 can be completed. In the production sequence, however, the device portions are first cut and separated at the position of the cut line 18 in the transverse direction, and a core slider block 20 having head device portions 14 aligned in a line is formed.

The slider blocks 20 thus separated are ground and machined, one by one, so as to form the float rails 15, 16 as shown in FIG. 15A. In other words, a groove 21 between the right and left float rails 15, 16, and a groove 22 between the adjacent sliders are formed. Next, while the core sliders are cut and separated, one by one, at the position of the cut line 19 at the center of the groove 22, they are bonded to a jig 23, with a predetermined gap, as shown in FIG. 15B, and are slid, by pushing them, to a lapping tape 25 bonded to a rubber stool 24 in such a manner as to grind the peripheral edges of the float rails 15, 16 and to conduct R chamfering. After R chamfering, the sliders are peeled from the jig 23, and are bonded and fixed one by one to gimbals 10 at the distal end of spring arms 11 as shown in FIG. 10. Then, while the slider 7 floats at a very small distance G, due to the circulated air caused by the revolution of the magnetic disk D, above the disk D recording and reproduction of information can be carried out.

In the CSS system apparatus, the force due to the circulated air does not instantaneously occur at the time of start and stop of the magnetic disk until the circulating air achieves a critical velocity. Consequently, the slider slides on the lubrication layer 6 of the magnetic disk. Because of this, wear gradually proceeds on both the lubrication layer 6 and the core slider 7 and, in the worst case, information in the magnetic film 4 of the magnetic disk can be lost.

To prevent such a problem, a carbon-type protective film 5 is formed on the magnetic disk surface and a layer 6 of the lubricant is further formed on the carbon-type protective film 5 as shown in FIG. 29, so as to reduce wear of the magnetic disk surface. However, as miniaturization of the magnetic disk apparatus has proceeded, CSS frequency is by far higher in a compact apparatus in which frequency of start/stop of the magnetic disk increases, than in a large-scale apparatus. Accordingly, counter-measures against wear have become more important.

When the wear of the magnetic disk surface proceeds and dust due to wear increases in the magnetic disk apparatus, the dust mixes with the lubricant on the magnetic disk surface and changes to debris. In other words, the dust of wear gathers together due to viscosity of the lubricant and grows to a lump. The debris, is clay-like and adheres to the slider 7 as represented by reference numeral 26 shown in FIG. 29, and upsets the balance of the slider. Therefore, stable floating becomes difficult, and the head is likely to impinge against the magnetic disk surface and to cause a head crash. When the debris adheres to the inflow slopes 15s and 16s as shown in FIG. 13, the floating distance decreases, and the head is likely to come into contact with the magnetic disk surface.

When the debris adheres to the magnetic disk surface, and the magnetic disk surface comes into contact with the slider during the CSS operation, the load to the motor becomes excessively large at the start. Accordingly, the magnetic disk is unable to rotate, or it impinges against the magnetic disk surface due to the reaction when the slider is freed from the magnetic disk surface, on a head crash occurs, or the magnetic disk surface is damaged.

On the other hand, a magnetoresistive type magnetic head (MR head) has been developed to satisfy the requirements for greater capacity and a smaller size in the magnetic disk apparatus. In the case of this MR head, the MR device is formed at the head device portion 14 shown in FIG. 13.

In the case of an apparatus wherein the magnetic head is very likely to come into contact with the magnetic disk due to the low flying height of the magnetic head or in the case of a floppy disk apparatus using the MR head or in the case of a magnetic tape apparatus or an apparatus wherein frequency of sliding is high or sliding always takes place, a head crash must be prevented and durability must be improved. However, the conventional carbon film does not have sufficient wear resistance.

Therefore, a thick protective film having thickness in the range of from about 300 Å to about 400 Å becomes necessary, but when the film becomes thick, the distance between the electromagnetic conversion device and the recording layer increases and recording and reproduction characteristics deteriorate. For this reason, the thickness of the protective film must be reduced to about 100 to about 200 Å. Further, because the conventional carbon protective film has a low insulating property, the current directly applied to the MR device is likely to leak to the magnetic disk, etc.

SUMMARY OF THE INVENTION

It is an object of the present invention to produce a magnetic recording medium which can eliminate the problems with the prior art described above, which has a protective film with high mechanical strength, and which has a adhesion strength between the protective film and the lubricant.

It is another object of the present invention to improve the slidability between the magnetic disk surface and the magnetic head.

The present invention provides a magnetic recording medium comprising a magnetic recording layer for storing information, a carbon protective layer for preventing damage to the magnetic recording layer and a lubrication layer which are sequentially laminated on a non-magnetic substrate, wherein the carbon type protective layer has a different hydrogen content between on the lubrication layer side and on the magnetic recording layer side.

The present invention further provides a magnetic head comprising a carbon type protective layer laminated on at least a sliding surface side of a magnetic head slider having an electromagnetic conversion device mounted thereto, and a layer of a lubricant disposed on the carbon type protective layer.

The present invention further provides a magnetic recording apparatus comprising a magnetic recording medium for storing information and a magnetic head for recording or reproducing the information to or from the recording medium, wherein a carbon type protective film having a different hydrogen content between at the upper surface portion thereof and at the lower initial portion thereof, is present at a sliding portion of the recording medium or the magnetic head.

BRIEF DESCRIPTION OF THE DRAWINGS

FIGS. 1A and 1B are schematic sectional views showing a magnetic recording medium according to an embodiment of the present invention in comparison with a prior art structure;

FIG. 2 is a table showing the characteristics of the embodiment of the present invention in comparison with the prior art shown in FIGS. 1A and 1B;

FIG. 7 is a table showing comparatively the process of the present invention and the conventional process shown in FIGS. 6A and 6B;

FIG. 18 is a Raman spectroscopic diagram showing the relationship between a $CH_4$ concentration of a hydrogen-containing carbon protective film and Id/Ig;

FIG. 19 is a graph showing the result of measurement of the relationship between a $CH_4$ concentration of a hydrogen-containing carbon protective film and a film resistance;

FIG. 22 is a Raman spectroscopic diagram showing the relationship between a $CH_4$ concentration and Id/Ig when a hydrogen-containing carbon protective film is produced by a substrate bias voltage application method;

FIGS. 23A and 23B shows the result of measurement of characteristic fluctuation on a magnetic disk, wherein FIG. 23A shows a prior art example and FIG. 23B shows an example wherein a substrate bias voltage is applied according to the present invention;

FIG. 24 shows the result of measurement of a film resistance of a carbon protective film Cm of a magnetic disk;

DESCRIPTION OF THE PREFERRED EMBODIMENTS

Figure 3:
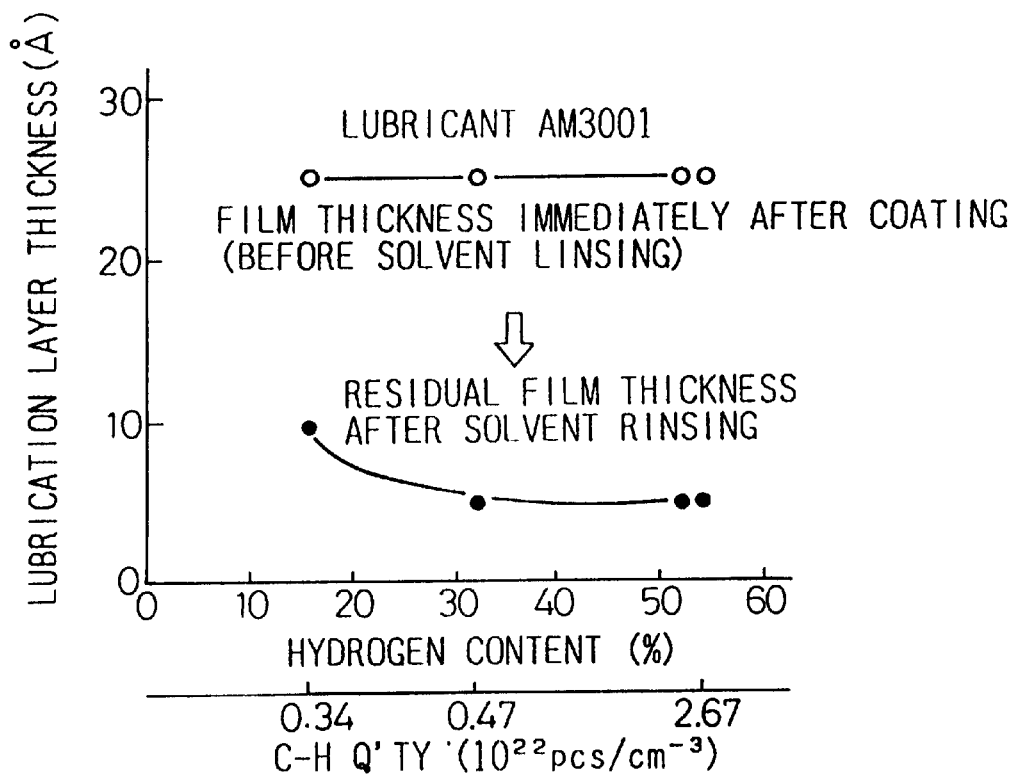
FIG. 3 is a graph obtained by plotting the results of FIG. 2.

In a magnetic recording medium according to the present invention, a carbon type protective layer preferably consists of a first carbon film 51 having a hydrogen content of at least 20% (or a C-H quantity of $0.4 \times 10^{22}$ cm$^{-3}$) next to a magnetic recording layer 4 and a second carbon film 52 having a hydrogen content of less than 20% (or a C-H quantity of $0.4 \times 10^{22}$ cm$^{-3}$) next to a lubrication layer 6. By the way, the term "hydrogen content" used in this specification represents a mean value.

The carbon type protective layer may be continuously formed in such a manner that the hydrogen content between the magnetic recording layer 4 side and the lubrication layer 6 side gradually changes.

Alternatively, the carbon type protective layer may have a hydrogen content of at least 20% (or a C-H quantity of 0.4×10$^{22}$ cm$^{-3}$) next to the magnetic recording layer 4 and a hydrogen content of less than 20% (or a C-H quantity of 0.4×10$^{22}$ cm$^{-3}$) next to the lubrication layer 6.

A lubricant that constitutes the lubrication layer 6 preferably consists of a perfluoropolyether having a functional group. The functional group of this perfluoropolyether is preferably a hydroxyl group or an aromatic group.

When a magnetic recording medium is produced by sequentially forming a magnetic recording layer for storing information, a carbon type protective layer for preventing damage of this magnetic recording layer and a lubrication layer on a non-magnetic substrate, the magnetic recording medium according to the present invention can be produced by irradiating ultra-violet rays onto the lubrication layer after this lubrication layer is coated.

In the method of the present invention described above, the lubrication layer preferably has a ratio, which is defined as "thickness of lubricant film after solvent rinsing/thickness of lubricant film before rinsing", of at least 0.4.

In the magnetic recording medium of the present invention, the magnetic recording layer (4) side of the carbon type protective layer has a relatively greater hydrogen content than the lubrication layer (6) side, as already described. Accordingly, the magnetic recording medium has good mechanical properties such as impact resistance during collision with a magnetic head, and high durability. On the other hand, because the carbon type protective layer on the side of the lubrication layer 6 has a smaller hydrogen content, it has high adhesion with the lubricant and can keep the lubricant operating for a long time.

If the carbon type protective layer is continuously formed so that the hydrogen content gradually changes between the magnetic recording layer (4) side and the lubrication layer (6) side, the bonding power inside the film of the carbon type protective layer can be improved.

When a perfluoropolyether having a hydroxyl group or an aromatic group as the functional group is used as the lubricant, it can reduce the reaction time because it has high chemical reactivity, and can consequently reduce the production time for the magnetic recording medium. Moreover, the bonding power between the lubricant and the carbon type protective layer can be improved, as well.

According to the production method of the magnetic recording medium in the present invention, the lubricant is coated on the carbon type protective layer, and then irradiated with ultra-violet rays, so that the chemical bonding power between the carbon type protective film and the lubricant can be promoted, the film decrease of the lubrication layer can be suppressed, and the lubrication performance can be maintained for a long time.

When the carbon type protective layer in the magnetic recording medium, onto which the ultra-violet rays are irradiated, is a hydrogen-containing film containing at least 20% of hydrogen or having a C-H content of at least 0.4×10$^{22}$ cm$^{-3}$, the lubricant comes to possess a long life because the protective layer has excellent mechanical properties and moreover, has high bonding strength with the lubricant.

When the carbon type protective layer in the magnetic recording medium, to which the ultra-violet rays are irradiated, has a hydrogen content of at least 20% (or a C-H quantity of at least 0.4×10$^{22}$ cm$^{-3}$) on the magnetic recording layer side, the protective layer becomes excellent in mechanical properties. When the carbon type protective layer has a hydrogen content of less than 20% (or a C-H quantity of less than 0.4×10$^{22}$ cm$^{-3}$) on the lubrication layer side, the bonding power can be improved between the carbon type protective layer and the lubricant, and lubrication performance has a long life.

Particularly when the lubrication layer consists of perfluoropolyehter having a functional group and particularly having a hydroxyl group or an aromatic group as the functional group, the adhesion between the protective layer and the lubricant is improved, long life of the lubrication layer can be accomplished, and the production time can be reduced.

When the ratio defined as "film thickness of lubricant film after solvent rinsing/film thickness before rinsing", as a characteristic of the lubricant, is at least 0.4, adhesion property can be increased between the protective layer and the lubricant, and the lubrication layer has a long life.

Next, how the magnetic recording medium according to the present invention and its production method are embodied in practice will be explained with reference to examples.

Re: Magnetic recording medium

FIGS. 1A and 1B are schematic sectional views showing an embodiment of the magnetic recording medium according to the present invention in comparison with a magnetic recording medium according to the prior art. FIG. 2 shows the result of examination of adhesion with the lubrication layer 6 using the hydrogen contents of both carbon type protective layers 5, 51 as a parameter.

The evaluation sample of the prior art structure shown in FIG. 1B was produced by sequentially laminating a Cr foundation layer 3 to a thickness of 1,000 Å, a CoCrTa recording layer 4 to a thickness of 500 Å and a hydrogen-containing protective film 5 to a thickness of 300 Å on a non-magnetic disk substrate of aluminum subjected to Ni-P plating, using a sputtering apparatus. Next, a perfluoropolyether (trade name: "Phonbrin AM3001", a product of Monte Cassini Co.) having an aromatic group as the functional group was coated on the hydrogen-containing carbon protective film 5 to a thickness of about 25 Å, and a product was thus completed. By the way, the hydrogen content of the carbon type protective film 5 was controlled by changing the ratio of Ar and a methane gas, and the adhesion of the lubricant was evaluated by a residual amount after rinsing with a fluorine type solvent.

It can be clearly seen from FIG. 2 that when the hydrogen content in the carbon film 5 exceeded 20% and reached 33%, 52% or 54%, the lubrication layer having the original film thickness of 25 Å only had a thickness of about 5 Å after rinsing, and even in the case of the lubricant having the functional group, its adhesion property remarkably dropped. In other words, the carbon type protective layer having a hydrogen content of at least 20% according to the prior art was excellent in mechanical properties, but its adhesion with the lubricant was low.

FIG. 3 shows the measurement results of FIG. 2 as a graph and presents the relationship between the hydrogen content in the carbon type protective layer and the adhesion property of the lubricant. As is clear from this graph, the smaller the hydrogen content in the carbon type protective layer, the greater the tendency of the film thickness of the residual lubricant after solvent rinsing to increase, and, therefore, the effect of the adhesion property of the lubricant is proved.

Figure 4:
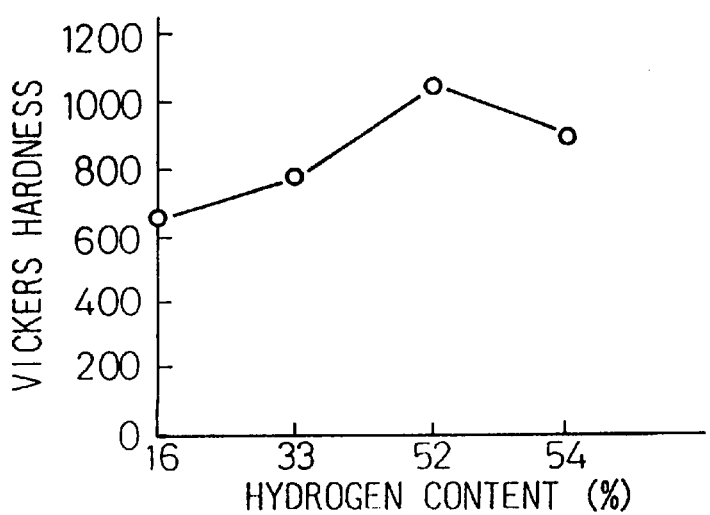
FIG. 4 is a graph showing the relationship between a hydrogen content and a film hardness of a carbon type protective film.

FIG. 4 represents the content introduced in "No. 16th Japan Magnetism Society", Proceedings (1992), p. 529. The abscissa in the graph represents the hydrogen content (%) in the carbon type film and the ordinate represents the Vickers hardness of the film. As is obvious from this graph, the greater the hydrogen content below about 52%, the higher the hardness of the carbon film and the more the wear resistance and the sliding characteristics can be improved.

As shown in FIG. 1A, the magnetic recording medium according to the present invention was produced by sequentially laminating a Cr foundation layer 3 to a thickness of 1,000 Å and a CoCrTa recording layer 4 to a thickness of 500 Å on a non-magnetic disk substrate 1 of aluminum applied with Ni-P plating, using a sputtering apparatus, in the same way as the prior art medium described above.

However, in the embodiment of the present invention, the hydrogen-containing carbon protective film had a two-layer structure having different hydrogen contents. In other words, a first carbon film 51 next to the magnetic recording layer 4 had a hydrogen content of at least 20% (or a C-H content of at least $0.4\times10^{22}$ cm$^{-3}$), and a second carbon film 52 next to the lubrication layer 6 had a hydrogen content of less than 20% (or a C-H quantity of less than $0.4\times10^{22}$ cm$^{-3}$). The lubrication layer 6 was constituted by a perfluoropolyether having a functional group.

As can be seen clearly from FIG. 2, when the hydrogen content exceeded 20%, the adhesion property of the lubricant dropped but the mechanical characteristics were excellent. On the other hand, when the hydrogen content was less than 20%, that is, in the case of the hydrogen content of 16%, a 10 Å-thick lubricant remained even after rinsing by the solvent, and thus it was found that the adhesion property was excellent.

Accordingly, according to the two-layered laminate structure of the present invention wherein the second carbon film 52 having a hydrogen content of less than 20% and having excellent adhesion property with the lubricant was laminated on the first carbon film 51 having a hydrogen content of at least 20% and having excellent mechanical characteristics, a magnetic recording medium having good mechanical characteristics, high durability, and high adhesion to the lubricant and able to keep the lubrication function for a long time could be produced, and the requirements for both durability and reliability could be satisfied simultaneously.

The greater the thickness of the carbon type protective layer, the greater the distance between the magnetic head and the magnetic recording layer 4, so that electromagnetic conversion efficiency dropped. It is therefore preferred that the total film thickness of the two protective layers 51, 52 was not more than 500 Å. By the way, the carbon type protective layer 52 on the lubrication layer (6) side may have only sufficient thickness that the bonding power of the lubricant can be improved. On the other hand, the first carbon film 51 next to the magnetic recording layer 4 for improving the mechanical strength preferably has a large film thickness.

This embodiment used sputtering using a mixed gas containing methane gas for the formation of the carbon type protective layers, but a mixed gas containing hydrogen can be used. Further, CVD, etc., can be used in place of sputtering. As the lubricant, perfluoropolyethers having other functional groups, such as Phobrin Zdol may be used besides Phonbrin AM3001, and similar effects can also be obtained.

In the explanation with reference to FIG. 1A, the hydrogen content changed at the boundary between the first carbon film 51 and the second carbon film 52. However, it is also possible to change the hydrogen content gradually. In this case, the hydrogen content next to the magnetic recording layer 4 is at least 20%, and the hydrogen content next to the lubrication layer 6 is set at not greater than 20% by gradually decreasing the hydrogen content. When the carbon type protective layer has a gradually decreasing hydrogen content, eliminating the boundary, the adhesion strength inside the carbon type protective layer can be improved.

Figure 5A:
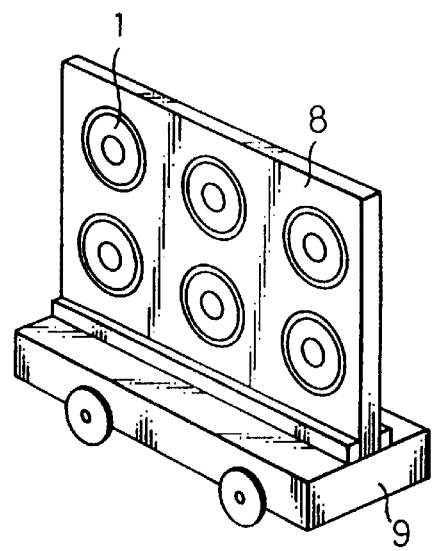
FIGS. 5A and 5B are schematic views showing an apparatus for continuously sputtering two layers having mutually different hydrogen contents.
Figure 5B:
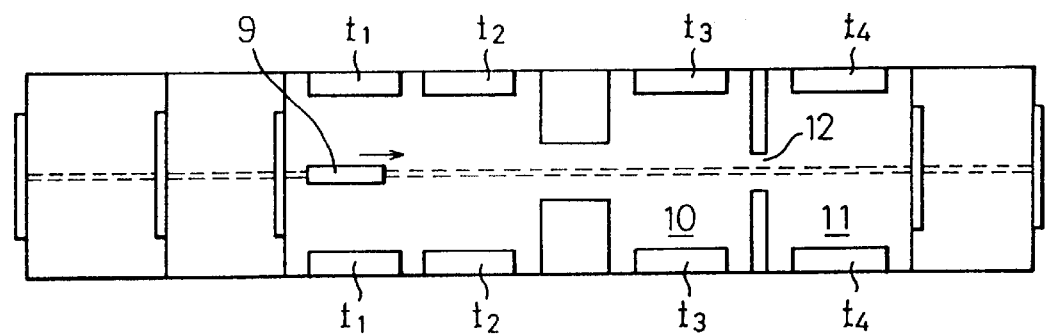

The formation of the films of the Cr foundation film 3, the recording layer 4 and the carbon type protective layers 51, 52 in FIG. 1A can be carried out by sequentially passing a carrier 9 in front of a Cr target t1, a magnetic material target t2 and hydrogen-containing targets t3, t4 as shown in FIG. 5B while the disk 1 is held by a substrate holder 8 as shown in FIG. 5A, so as to sequentially laminate each film on both surfaces of each disk 1.

In FIG. 5B, the hydrogen-containing carbon target t3 inside the sputter chamber 10 is for forming the first hydrogen-containing carbon film 51 shown in FIG. 1, and a methane gas mixing ratio inside the sputter chamber 10 is set to be at least 10% so that the hydrogen content becomes at least 20%. The hydrogen-containing carbon target t4 in the next sputter chamber 11 is for forming the second hydrogen-containing carbon film 52 shown in FIG. 1, and the methane gas mixing ratio inside the sputter chamber 11 is set to be less than 10% so that the hydrogen content becomes less than 20%.

When a partition opening 12 between both sputter chambers 10, 11 is made as narrow as possible, film formation having different hydrogen contents is effected between the first carbon film 51 and the second carbon film 52 as shown in FIG. 1A.

Re: Production process of magnetic recording medium

Figure 6A:
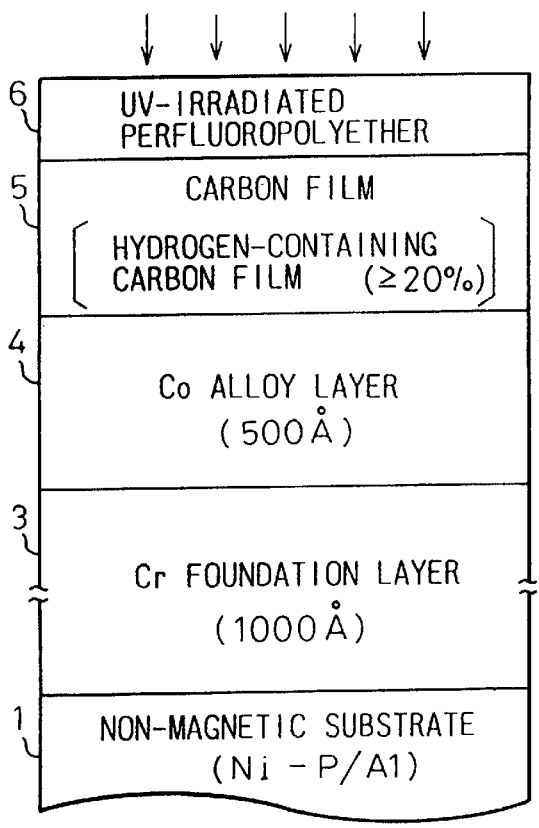
FIGS. 6A and 6B are schematic sectional views of a magnetic recording medium, and show a process for producing the magnetic recording medium according to the present invention in comparison with the conventional process.
Figure 6B:
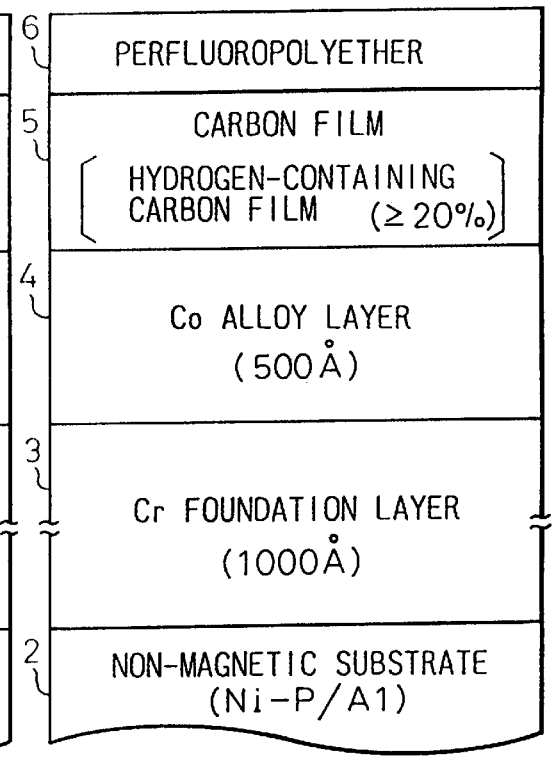

FIGS. 6A and 6B are schematic sectional views showing an embodiment of the production method of the magnetic recording medium according to the present invention in comparison with the prior art method. FIG. 7 shows the result of examination of the adhesion with the lubricant using the hydrogen contents and the ultra-violet ray irradiation time of both of the carbon type protective layers as the parameters.

The evaluation sample of the prior art structure shown in FIG. 6B was produced by sequentially laminating the Cr foundation layer 3 to a thickness of 1,000 Å, the CoCrTa recording layer 4 to a thickness of 500 Å and the hydrogen-containing protective film 5 to a thickness of 300 Å on the non-magnetic disk substrate 1 of aluminum subjected to Ni-P plating, by using the sputtering apparatus, and then coating a perfluoropolyether having an aromatic group as the functional group ("Phonbrin AM3001", a trade name of Monte Cassini Co.) to a thickness of about 25 Å on the hydrogen-containing protective film 5. The hydrogen content of the carbon type protective film 5 was controlled by changing the mixing ratio of Ar and the methane gas, and the adhesion to the lubricant was evaluated by measuring the remaining quantity after rinsing with a fluorine type solvent.

As can be seen clearly from FIG. 7, when the hydrogen content in the carbon film 5 exceeded 20% and reached 33%, the film thickness of the carbon film changed from the initial film thickness of 25 Å to only about 5 Å after rinsing, and that even in the case of a lubricant having the functional group, its adhesion dropped remarkably.

In contrast, when the ultra-violet rays were irradiated onto the lubricant consisting of perfluoropolyether after the sample was formed by sequentially laminating the Cr foundation layer 3 to a thickness of 1,000 Å and the CoCrTa recording layer 4 to a thickness of 500 Å on the non-magnetic disk substrate 1 of aluminum subjected to Ni-P plating, by using the sputtering apparatus as shown in FIG. 6A, the residual quantity of the lubricant increased to at least two times even when the hydrogen content was 33%, as shown in FIG. 7. By the way, ultra-violet radiation having 185 nm and 254 nm wavelength components was used.

FIGS. 8A to 8D show other measurement results. The abscissa represents the ultra-violet ray irradiation time and the ordinate represents the thickness of the lubrication layer. The oblique line region represents the film thickness remaining after solvent rinsing. Though the film thickness is different between FIGS. 8A and 8B, they represent an example of normal carbon having a hydrogen content of less than 20%. In this case, too, the adhesion property of the lubricant was improved by irradiating with ultra-violet radiation for at least 30 seconds.

Figure 8A:
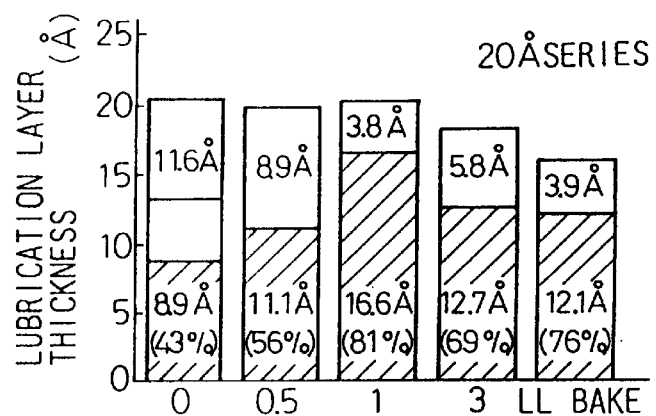
FIGS. 8A to 8D show the measurement results of the relationship between a UV irradiation time and an adhesion quantity of a lubricant.
Figure 8B:
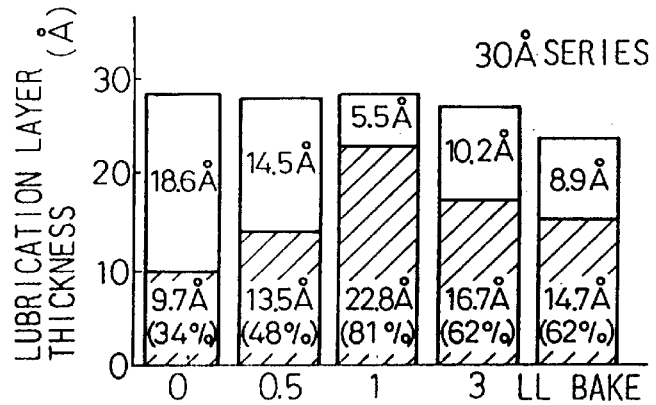
Figure 8C:
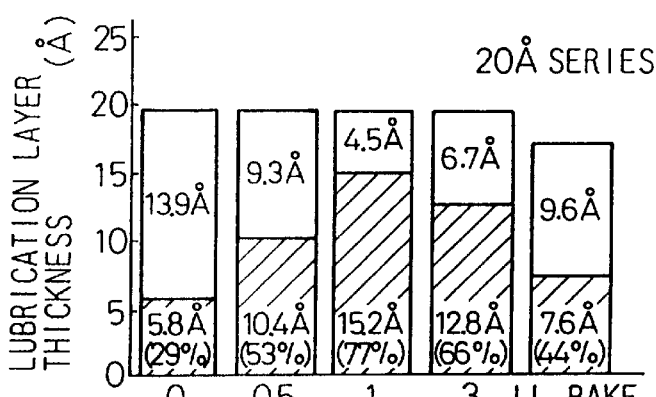
Figure 8D:
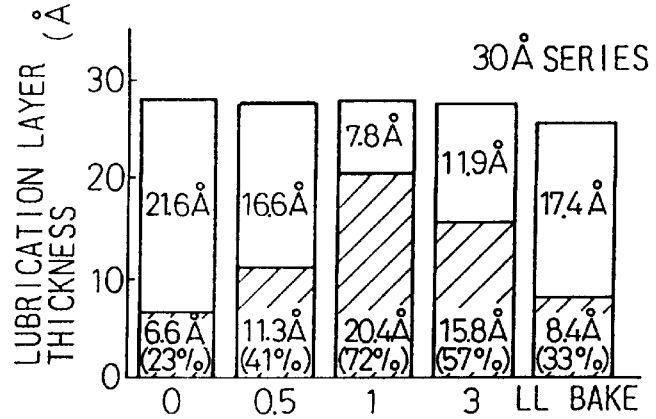

FIGS. 8C and 8D show an example of diamond-like carbon having hydrogen content of at least 20%, though the film thickness of the lubrication layer is different between them. In this case, too, the adhesion property of the lubricant was improved when it was irradiated with the ultra-violet radiation for at least 30 seconds.

On the basis of the examination results described above, the present invention completed a magnetic recording medium by carrying out the irradiation by ultra-violet radiation after the coating of the lubricant in a magnetic recording medium having a carbon-type protective layer 5 having a hydrogen content of at least 20% in comparison with the prior art. When the ratio "film thickness of lubricant after solvent rinsing/film thickness of lubricant before rinsing" is used as the index of the adhesion strength, the lubricant formed on the carbon film obtained by sputtering in a pure Ar atmosphere according to the prior art had a ratio of about 40%, whereas the magnetic recording medium according to the present invention can set this ratio to at least 40% by irradiation with the ultra-violet radiation. By the way, the film thickness of the carbon type protective layer 5 is preferably not greater than 500 Å lest the distance between the magnetic head and the magnetic recording layer 4 increases and signal quality drops.

When a second carbon film 52 having a hydrogen content of less than 20% is laminated on a first carbon film 51 having a hydrogen content of at least 20% next to the magnetic recording layer, and the irradiation with ultra-violet radiation was carried out after the lubricant was coated using the sputtering apparatus, shown in FIG. 5, as set forth in the appended claim 6, the adhesion strength between the lubricant and the hydrogen-containing carbon type protective layer can be further improved due to the synergistic effect of the UV irradiation and the adhesion of the lubricant to the second carbon film 52.

The embodiment described above used the sputtering method using a mixed gas of the methane gas. However, a mixed gas containing hydrogen can be used, and CVD, etc., may be used in place of sputtering. Further, the lubricant is not limited only to Phonbrin AM3001, and similar effects can be obtained by using other perfluoropolyethers having a functional group such as Phonbrin Zdol. Though the evaluation of the lubrication layer was made at a film thickness of at least 20 Å, a film thickness below 20 Å can also be used, and a film thickness below 10 Å becomes possible when the adhesion strength of the lubricant is improved according to the present invention.

In the magnetic recording medium according to the present invention, the carbon type protective layer has a structure wherein the hydrogen content is relatively greater on the side nearer the magnetic recording layer 4 than on the side nearer the lubrication layer 6. Accordingly, the magnetic recording medium has good mechanical characteristics, such as impact resistance, and high durability. Moreover, because the hydrogen content is smaller near the lubrication layer 6 and the adhesion property between the carbon type protective layer and the lubricant can be improved, the lubrication operation can be maintained for a long time. Accordingly, the both mechanical strength of the protective layer and the adhesion strength of the lubricant can be simultaneously satisfied, and a magnetic recording medium having high long term reliability can be accomplished.

Since the adhesion strength between the carbon type protective layer and the lubrication layer can be improved, the film thickness decrease of the lubrication layer can be suppressed. Therefore, the film thickness of the lubrication layer and the carbon type protective layer can be reduced in a film thickness which is secured in consideration of the film decrease. As a result, the distance between the magnetic head and the magnetic recording layer can be reduced and the electromagnetic conversion characteristics and the signal quality can be improved. Further, the thickness of the magnetic recording medium can be reduced.

When the carbon type protective layer is continuously formed in such a manner that the hydrogen content gradually changes from the magnetic recording layer side to the lubrication side, the film bonding power inside the carbon type protective layer can be increased.

According to the production method of the magnetic recording medium which irradiates with the lubricant the ultra-violet rays after application, the chemical bonding power between the lubricant and the carbon type protective layer can be promoted even when a carbon type protective layer having excellent mechanical characteristics and a hydrogen content of at least 20% is used. Accordingly, the film thickness decrease of the lubrication layer can be suppressed and a magnetic recording medium having a lubrication operation for a long time and high durability can be accomplished in the same way as the invention of the magnetic recording medium described above.

In the magnetic head according to the second aspect of the present invention, the carbon type protective layer is preferably a hydrogen-containing carbon film having a hydrogen content of at least 20% (or a C-H quantity of at least $0.4 \times 10^{22}$ cm$^{-3}$).

Figure 9A:
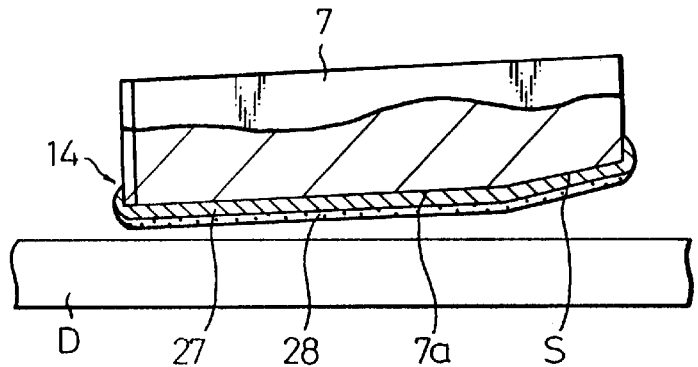
FIGS. 9A to 9C are sectional views of principal portions of magnetic heads according to various embodiments of the present invention.
Figure 9B:
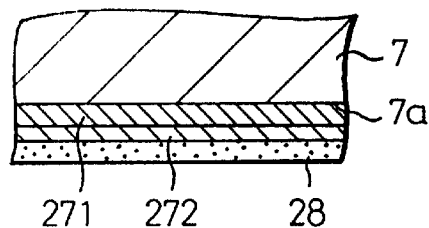

As shown exemplarily in FIG. 9B, this hydrogen-containing carbon film preferably has a relatively smaller hydrogen content on the side nearer the lubrication layer 28 than on the side nearer the magnetic head slider 7.

Preferably, this hydrogen-containing carbon film consists of a first carbon film 271 having a hydrogen content of at least 20% (or a C-H quantity of at least $4 \times 10^{22}$ cm$^{-3}$) on the side nearer the magnetic head slider 7 and a second carbon film 272 having a hydrogen content of less than 20% (or a C-H quantity of less than $0.4 \times 10^{22}$ cm$^{-3}$) on the side nearer the lubrication layer 28.

Further, this hydrogen-containing carbon film may be continuously formed so that the hydrogen content gradually changes from the side nearer the magnetic head slider 7 to the side nearer the lubrication layer 28.

Alternatively, the hydrogen-containing carbon film may have a hydrogen content of at least 20% (or a C-H quantity of at least $0.4 \times 10^{22}$ cm$^{-3}$) on the side nearer the magnetic head slider 7 and a hydrogen content of less than 20% (or a C-H quantity of less than $0.4 \times 10^{22}$ cm$^{-3}$) on the side nearer the lubrication layer 28.

The lubrication layer 28 preferably consists of a perfluoropolyether having a functional group such as a hydroxyl group or an aromatic group.

Figure 9C:
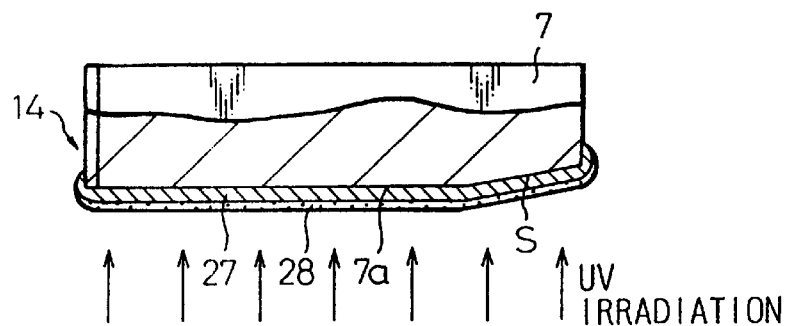

When a magnetic head is produced by sequentially laminating a carbon type protective layer 27 and a lubrication layer 28 on at least the side of a lubrication surface in a magnetic head slider having an electromagnetic conversion device mounted thereto, as shown exemplarily in FIG. 9C, the magnetic head according to the present invention can be produced by irradiating ultra-violet radiation onto the lubrication layer after the lubrication layer is applied.

In the production method according to the present invention, it is also possible to form the hydrogen-containing carbon film in such a manner that the hydrogen content becomes relatively smaller on the side nearer the lubrication layer 28 than on the side nearer the magnetic head slider 7, then to coat the lubrication layer, and thereafter to carry out the irradiation of the ultra-violet rays. Further, rinsing treatment with a solvent may be carried out after the irradiation with ultra-violet rays.

As described above, the magnetic head according to the present invention has a structure wherein the carbon type protective layer 27 is laminated on at least the sliding surface side of the magnetic head slider and the layer of the lubricant 28 is disposed on the protective layer 27. Accordingly, the carbon type protective layer 27 having excellent mechanical properties opposes the magnetic disk surface, and can prevent damage to the sliding surface of the slider such as head crash. Moreover, since the adhesion strength is high between the carbon type protective layer and the lubricant, wearing dust hardly occurs.

When the carbon type protective layer on the sliding surface of the slider consisting of a hydrogen-containing carbon film having a hydrogen content or at least 20% or a C-H quantity of at least $0.4 \times 10^{22}$ cm$^{-3}$, mechanical properties such as hardness and impact resistance are excellent, head crashes, etc., do not occur, and slidability with respect to the magnetic disk surface can be improved because the lubricant adheres to the surface.

Further, when the hydrogen content of hydrogen-containing carbon film is relatively greater on the side nearer the slider 7 than on the side nearer the lubrication layer 28, mechanical properties such as impact resistance at the time of collision of the magnetic head against the magnetic disk surface are high, head crashes do not occur and the durability can be improved.

On the other hand, when the hydrogen content of the hydrogen-containing carbon film on the side of the lubrication layer 28 is small, the adhesion strength of the lubricant such as a perfluoropolyether having a functional group is extremely high and the lubrication operation can be maintained for a long time. In this way, the magnetic head according to the present invention can satisfy both of the requirements for the mechanical strength as the protective layer when it comes into contact with the magnetic disk surface, and the adhesion strength of the lubricant exhibiting the lubrication operation with the magnetic disk surface.

When the film formation is continuously made so that the hydrogen content of the hydrogen-containing carbon film gradually changes from the side nearer the slider 7 and the side nearer the lubrication layer 28, the bonding strength inside the film of the hydrogen-containing carbon film can be improved and durability of the magnetic head can be improved.

When the perfluoropolyether having a hydroxyl group or an aromatic group as the functional group is used as the lubricant, the reaction time can be reduced because chemical reactivity is high, and eventually, the required production time for the magnetic head can be reduced. Moreover, because the bonding strength between the lubricant and the carbon type protective layer can be improved, the lubrication layer of the sliding surface of the slider has long life.

When the ultra-violet rays are irradiated after the lubrication layer 28 is applied to the carbon type protective layer 27 of the magnetic head slider, the chemical bonding strength between the carbon type protective film 27 and the lubrication layer 28 can be promoted. Accordingly, the film thickness decrease of the lubricant on the core slider surface can be suppressed, and lubrication performance can be maintained for a long time, and the occurrence of debris due to wear dust can be restricted.

Further, when solvent rising treatment is carried out after irradiation with ultra-violet radiation, only the lubricant which has high chemical absorption power with the carbon type protective layer remains. For this reason, the lubrication operation can be maintained for a longer period.

Next, how the magnetic head of the present invention and the production method thereof are embodied in practice will be explained with reference to Examples.

Re: Magnetic head

FIG. 9A is a sectional view of the principal portions of the magnetic head according to the first Example of the present invention. In a magnetic head slider 7 having an electromagnetic conversion device 14 mounted thereto, a carbon type protective layer 27 was laminated on at least its sliding surface 7a, and a layer 28 of the lubricant was laminated on this protective layer 27.

The carbon type protective layer 27 and the lubrication layer 28 needs to be disposed only on the surface which might come into contact with the magnetic disk D on the slider surface, that is, on at least the sliding surface side of the slider. The carbon type protective layer 27 was preferably formed by sputtering and the layer 28 of the lubricant was preferably and easily formed by coating.

Figure 13:
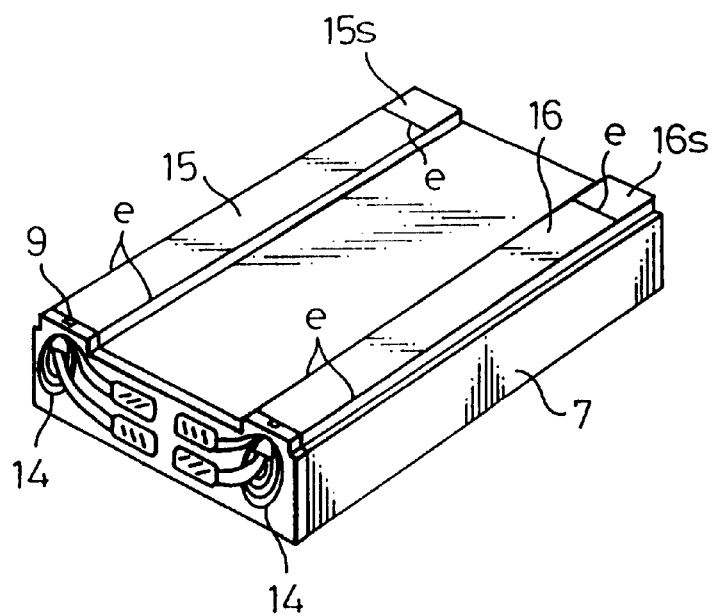
FIG. 13 is a perspective view of a conventional thin film type magnetic head.
Figure 14:
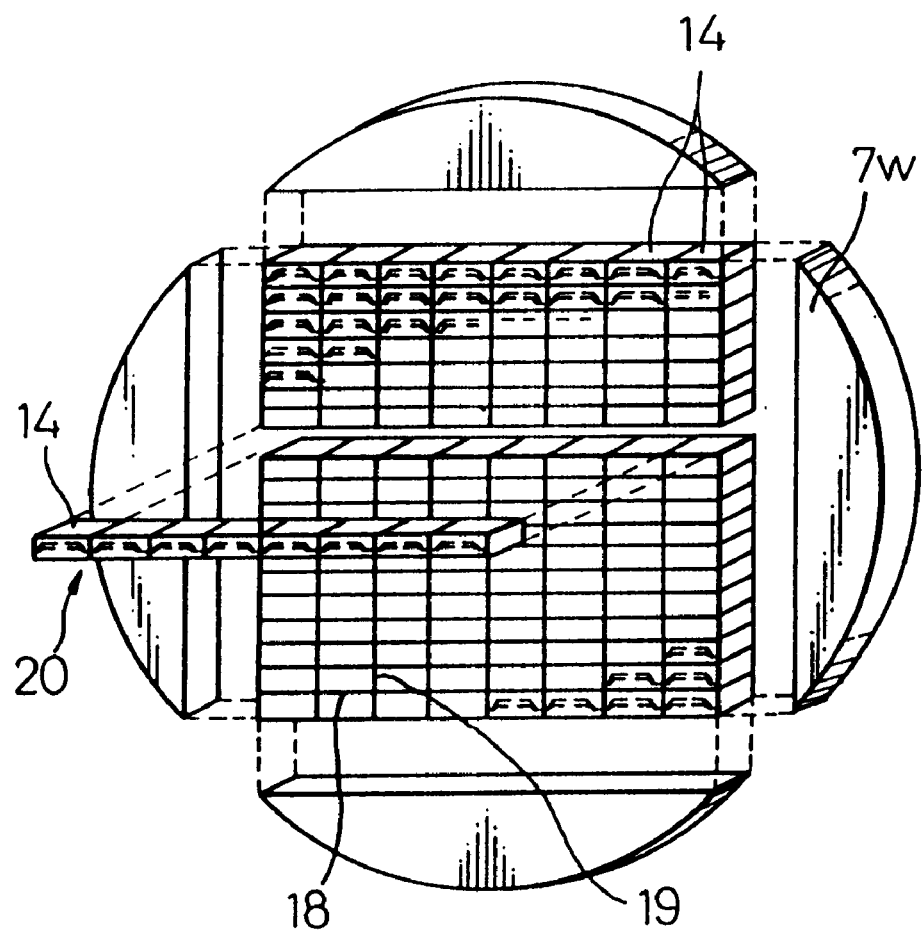
FIG. 14 is a schematic view showing a process for mass-producing thin film magnetic heads.
Figure 15A:
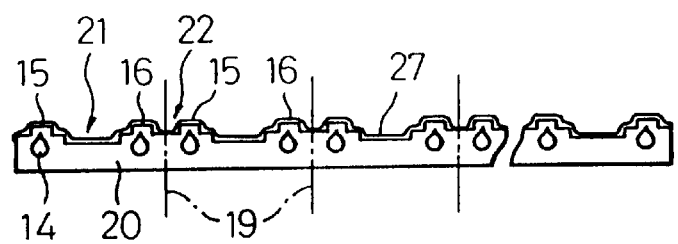
FIGS. 15A and 15B are side views showing a slider block state, respectively.
Figure 15B:
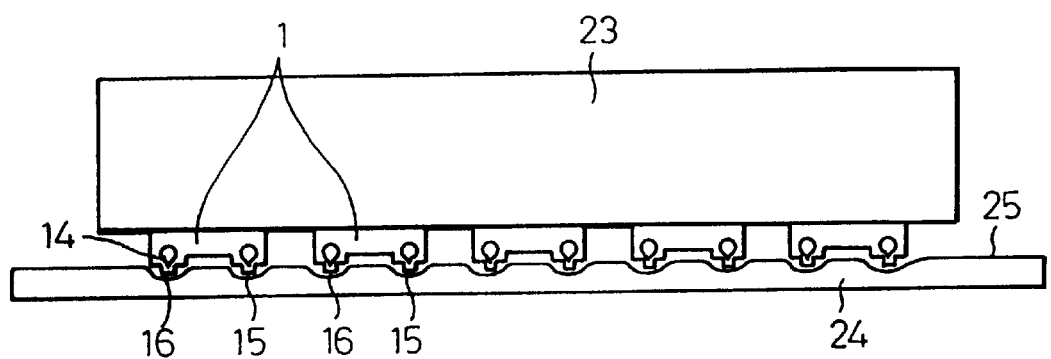

As a method of laminating the carbon type protective layer 27 and the lubrication layer 28 on the slider sliding surface, it was possible to laminate them one by one after the magnetic head shown in FIG. 13 was completed, but it was also possible to fit one or a plurality of blocks, which were integrally connected as shown in FIG. 15A, to a jig and then to carry out sputtering. The lubricant might be applied to the heads in the block state or after completion. When R molding was effected as shown in FIG. 15B, a plurality of sliders were fitted to the jig after R molding, and the carbon type protective layer 27 and the lubrication layer 28 were laminated together.

When the carbon-type protective layer 27 in the slider shown in FIG. 9A was constituted by a hydrogen-containing carbon film having a hydrogen content of at least 20% or a C-H quantity of at least $0.4 \times 10^{22}$ cm$^{-3}$, mechanical properties such as hardness and impact resistance became higher than conventional normal carbon. Accordingly, head crashes, etc., did not occur. Since the lubricant adhered to the surface, slidability with the magnetic disk surface could be improved. By the way, the present invention can be applied to various sliders having different slider shapes and using different slider materials.

Re: Evaluation of magnetic head of the invention

Figure 10A:
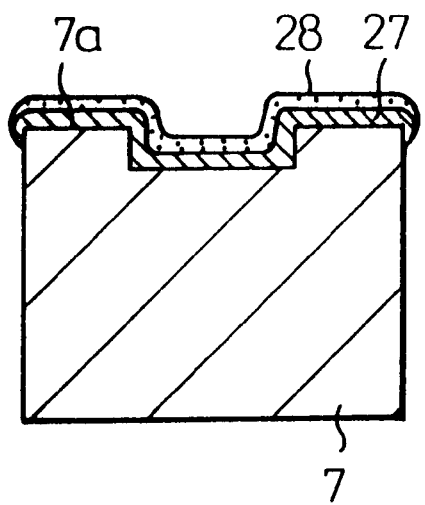
FIGS. 10A and 10B are schematic sectional views of magnetic heads for evaluation, respectively.
Figure 10B:
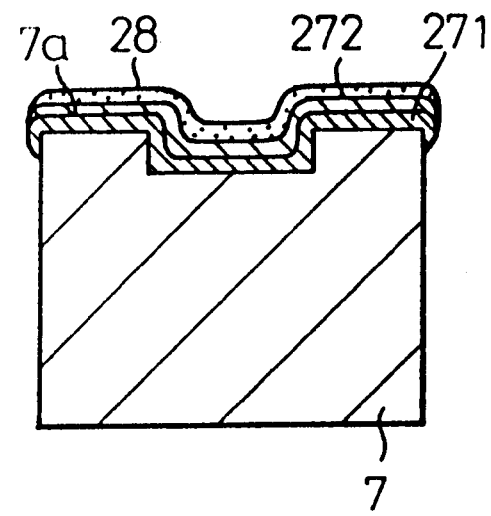

Next, the action and effect of laminating the carbon type protective layer 27 and the lubrication layer 28 on the slider sliding surface as in the present invention will be explained on the basis of an experimental example. FIGS. 10A and 10B show magnetic head sliders which are fabricated for evaluating the action and effect. In FIG. 10A, carbon type protective layer 27 was laminated on at least the side of the sliding surface 27a of the magnetic head slider 7, and a layer 28 of the lubricant was disposed on the protective layer 27.

In FIG. 10B, on the other hand, a first carbon film 271 having a hydrogen content of at least 20% (or a C-H quantity of at least $0.4 \times 10^{22}$ cm$^{-3}$) was formed on the magnetic head slider 7, a second carbon film 272 having a hydrogen content of less than 20% (or a C-H quantity of less than $0.4 \times 10^{22}$ cm$^{-3}$) was formed on the first carbon film 271 and thereafter the lubrication layer 28 was laminated.

Several paris of the two kinds of evaluation samples having different layer structures were produced, and adhesion property with the lubrication layer 28 was examined using the hydrogen contents of the carbon type protective layers 271, 272 of the respective samples as the parameters. The result is shown in FIG. 3.

The evaluation sample shown in FIG. 10A, wherein the carbon type protective layer had a single-layered structure, was produced by forming the hydrogen-containing carbon protective film 27 to a thickness of 500 Å on an Al$_2$O$_3$TiC substrate using a sputtering apparatus and then coating a perfluoropolyether (trade name: "Phonbrin AM3001", a product of Monte Cassini Co.) to a thickness of about 25 Å. By the way, the hydrogen content of the carbon type protective film 27 was controlled by changing the mixing ratio of Ar and methane gas, and the adhesion property of the lubricant was evaluated by the residual quantity left after rinsing in a fluorine type solvent.

As can be clearly seen from FIG. 2, when the hydrogen content in the hydrogen-containing carbon film 27 exceeded 20% and reached 33%, 52% and 54%, the lubrication layer having the initial thickness of 25 Å remained in the thickness of only about 5 Å after rinsing. In other words, it could be understood that even in the case of the lubricant having the functional group, the adhesion property dropped remarkably. In other words, the hydrogen type protective layer having a hydrogen content of not less than 20% was excellent in mechanical characteristics, but its adhesion strength with the lubricant was low.

As is obvious also from FIG. 3, the greater the decrease in the hydrogen content of the carbon type protective layer, the greater became the thickness of the residual lubricant after solvent rinsing, and the effect of the adhesion property of the lubricant appeared.

As can be clearly seen from FIG. 4, when the hydrogen content was smaller than about 52%, the hardness of the carbon film increased with the increase of the hydrogen content, and wear resistance as well as impact resistance could be improved.

As shown in FIG. 10B, the magnetic head slider, the carbon type protective layer of which had the two-layered structure consisting of the first carbon film 271 and the second carbon film 272 was produced by first forming a film of the first carbon film having a hydrogen content of at least 20% (or a C-H quantity of at least $0.4 \times 10^{22}$ cm$^{-3}$) by sputtering on an Al$_2$O$_3$TiC substrate, then forming the second carbon film 272 having a hydrogen content of less than 20% (or a C-H quantity of less than $0.4 \times 10^{22}$ cm$^{-3}$) on the first carbon film 271, and coating a perfluoropolyether, having a functional group, as the lubrication layer 28.

As can be clearly seen from FIG. 2, when the hydrogen content exceeded 20%, the adhesion property of the lubricant was inferior, though the mechanical characteristics were excellent. On the other hand, when the hydrogen content was less than 20%, that is, when it was 16%, a 10 Å-thick lubricant remained even after solvent rinsing, and it was determined that the adhesion property was excellent.

Accordingly, when the two-layered structure wherein the second carbon film 272 having a hydrogen content of less than 20% and having excellent adhesion property with the lubricant was formed on the first carbon film 271 having a hydrogen content of at least 20% and having excellent mechanical characteristics was employed, a magnetic head which was excellent in mechanical characteristics, had excellent durability and high adhesion with the lubricant and exhibited the lubrication operation for a long time could be accomplished, and the requirements for both durability and reliability could be satisfied.

The greater the thickness of the carbon type protective layer, the greater became the distance between the head device portion 14 of the magnetic head and the magnetic disk D, and the greater became the drop of electromagnetic conversion efficiency. Accordingly, the sum of the film thickness of the two protective layers 271 and 272 was preferably not greater than 500 Å. By the way, the film thickness of the carbon type protective layer 272 on the lubricant side may be to such an extent that the adhesion strength of the lubricant can be improved, and the carbon type protective layer 271 on the slide side for improving the mechanical strength was preferably formed to a greater film thickness.

Though this embodiment employed sputtering using the mixed gas containing methane gas as the method of forming the carbon type protective films, other mixed gases could by used so long as they contained hydrogen, and CVD, etc., might be utilized in place of sputtering. Further, besides Phonbrin AM3001, other perfluoropolyethers having a functional group such as Phonbrin Zdol could also be used as the lubricant, and similar effects could be obtained in this case.

In the explanation with reference to FIG. 10B, the hydrogen content changed at the boundary between the first carbon film 271 and the second carbon film 272, but the hydrogen content could be changed little by little. In this case, the hydrogen content at the slider (7) side was at least 20%, and was gradually decreased so that it became not greater than 20% at the lubrication layer (28) side.

As described above, the adhesion strength inside the carbon type protective layer could be improved by forming the carbon type protective layers in which the hydrogen contents gradually decreased, and eliminating the boundary. Accordingly, it was effective to continuously change the hydrogen content in such a manner as to eliminate the boundary between the carbon type protective layers 271 and 272 on the slider sliding surface in the embodiment shown in FIG. 9B.

Figure 11A:
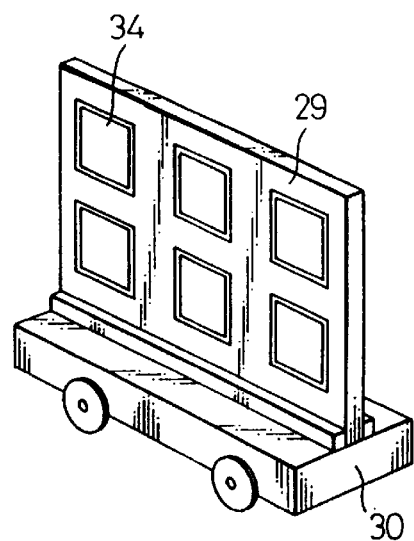
FIGS. 11A and 11B are schematic views showing an apparatus for continuously sputtering two layers having mutually different hydrogen contents.

To form the second carbon film 272 on the first carbon film 271 as shown in FIG. 10B, the carrier 30 was passed in front of the Cr target t1, the magnetic material target t2, and the hydrogen-containing carbon targets t3, t4 while the jig 34 having the slider block fitted thereto was held by the jig holder 29 as shown in FIG. 11A so as to sequentially laminate the films on the sliding surface side of the slider block.

Figure 11B:
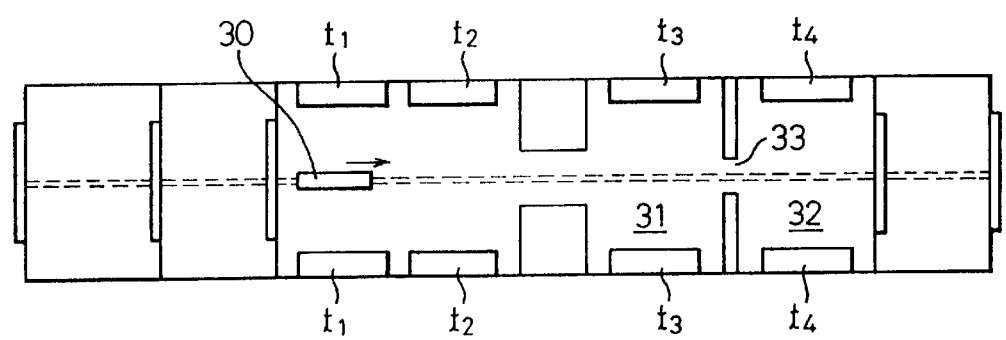

The hydrogen-containing carbon target t3 in the sputter chamber 31 in FIG. 11B was for forming the first hydrogen-containing carbon film 271 in FIG. 10B, and the methane gas mixing ratio in the sputter chamber 31 was set to at least 10%. The hydrogen-containing carbon target t4 in the next sputter chamber 32 was for forming the second hydrogen-containing carbon film 272 in FIG. 10B, and the methane gas mixing ratio inside the sputter chamber 32 was set to be less than 10%.

When the partition opening 33 between both sputter chambers 31 and 32 was made as narrow as possible, the formation of the films having different hydrogen contents was effected between the first carbon film 271 and the second carbon film 272 as shown in FIG. 10B.

Re: Production method of magnetic head

Next, the production method of the magnetic head by irradiation with the ultra-violet radiation will be explained. When a magnetic head having a carbon type protective layer 27 and a lubrication layer 28 sequentially laminated on at least the sliding surface side in the magnetic head slider 7 having the electromagnetic conversion device 14 mounted thereto is produced as shown in FIG. 9C, the magnetic head of the present invention is completed by irradiating the ultra-violet rays after the lubrication layer 28 is coated. To evaluate the action and effect brought forth by the irradiation of the ultra-violet rays, magnetic heads for evaluation, shown in FIGS. 12A and 12B, were produced.

Figures 12A, 12B:
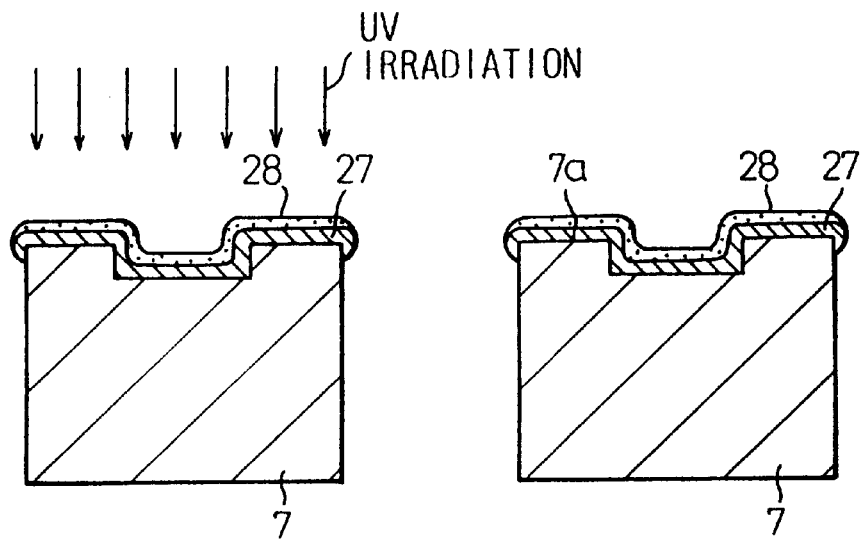
FIGS. 12A and 12B are schematic sectional views showing a process for producing a magnetic head by UV irradiation in comparison with a process which does not involve UV irradiation.

FIG. 12A shows the magnetic head in which the lubricant was coated after the carbon type protective film 27 was formed on the slider and then the irradiation with the ultra-violet rays was effected, FIG. 12B shows the magnetic head in which the irradiation of the ultra-violet rays was not effected after the application of the lubricant. The adhesion property with the lubricant was examined by using the hydrogen content of each carbon type protective film 27 and the ultra-violet ray irradiation time as the parameters, and the result was naturally the same as that of FIG. 7.

The evaluation sample without the ultra-violet ray irradiation shown in FIG. 12B was fabricated by sequentially depositing hydrogen-containing carbon protective film 27 on the $Al_2O_3TiC$ substrate, using a sputtering apparatus, to a thickness of 500 Å, and then coating a perfluoropolyether (trade name: "Phonbrin AM3001", a product of Monte Cassini Co.) having an aromatic group as a functional group on the carbon protective film 27 to a thickness of about 25 Å. By the way, the hydrogen content of the carbon type protective film 27 was controlled by changing the mixing ratio of Ar and the methane gas, and the adhesion property of the lubricant was evaluated by the residual quantity after rinsing with a fluorine type solvent.

As can be clearly seen from FIG. 7, when the hydrogen content in the carbon film 27 exceeded 20% and reached 33%, the lubricant having the initial film thickness of 25 Å remained only in a thickness of about 5 Å when the ultra-violet radiation was not used. It could be thus appreciated that even in the case of the lubricant having the functional group, its adhesion property dropped remarkably.

In contrast, when the hydrogen-containing carbon type protective film 27 was deposited on the $Al_2O_3TiC$ substrate to a thickness of 500 Å by the sputtering apparatus as shown in FIG. 12A, and the lubricant consisting of the perfluoropolyehter was coated and thereafter irradiation by ultra-violet radiation was effected for 30 or 60 seconds, the residual quantity of the lubricant increased by at least two times even when the hydrogen content was 33%, as shown in FIG. 7.

When the ratio "film thickness of lubricant after solvent rinsing/film thickness of lubricant after rinsing" was used as the index of the adhesion strength of the lubricant, the lubricant on the normal carbon film having the hydrogen content of less than 20% was about 40% as shown in FIG. 7, but the ratio of the magnetic head for evaluation, shown in FIG. 12A, could be set to at least 40% depending on the ultra-violet radiation irradiation. By the way, this example used ultra-violet radiation at a strength of 8 mw and with wavelength components of 185 nm and 254 nm.

The relationship between the irradiation time and the thickness of the lubrication layer was the same as shown in FIG. 8.

On the basis of the result of examination described above, the inventors of the present invention completed a magnetic head by forming a normal carbon protective layer 27 having a hydrogen content of less than 20% on the slider sliding surface by sputtering as shown in FIG. 9C, then coating the lubricant and effecting the irradiation by the ultra-violet radiation. As can be clearly seen from the results shown in FIGS. 7, 8A and 8B, when the lubricant was coated onto the normal carbon film and then were irradiated, the adhesion property of the lubricant was further improved and consequently, the life of the lubrication operation could be further extended.

In contrast, as can be seen clearly from the results shown in FIGS. 7, 8C and 8D, when the lubricant was coated to the hydrogen-containing carbon film having a hydrogen content of at least 20% and irradiated, the adhesion property of the lubricant could be similarly improved. Accordingly, when the hydrogen-containing film 27 having a hydrogen content of at least 20% was formed on the slider sliding surface by sputtering, the lubricant was coated and thereafter the irradiated, the adhesion property of the lubricant could be improved. Because the hydrogen-containing carbon film having a hydrogen content of at least 20% had high mechanical strength, a magnetic head having excellent hardness and impact resistance could be obtained.

When the second carbon film 272 having a hydrogen content of less than 20% was laminated on the first carbon film having a hydrogen content of at least 20% by using the sputtering apparatus shown in FIGS. 11A and 11B and the irradiation was effected after coating the lubricant, the adhesion strength between the lubricant and the hydrogen-containing carbon type protective layer could be further improved due to the irradiation of the ultra-violet rays in combination with the adhesion operation of the lubricant of the second carbon film 272 having a smaller hydrogen content. Accordingly, when the first carbon film having a greater hydrogen content and the second carbon film having a smaller hydrogen content were formed on the slider sliding surface and then the irradiation was effected after coating of the lubricant, the adhesion strength of the lubricant could be further improved.

When the samples for evaluation were produced, sputtering using the mixed gas containing methane gas was employed as the method of forming the carbon type protective layer, but a mixed gas containing hydrogen could also be used, and CVD could be used in place of sputtering. Further, besides Phonbrin AM3001, other perfluoropolyethers having a functional group, such as Phonbrin Zdol, provided the similar effect. A film thickness of at least 20 Å was used for the evaluation of the lubricant, but a thickness of not greater than 10 Å could also be used particularly when the adhesion strength of the lubricant was improved according to the present invention.

According to a structure such as that of the magnetic head of the present invention wherein the carbon type protective film having a hydrogen content of at least 20% is formed on at least the sliding surface of the magnetic head slider or wherein the carbon type protective layers having different hydrogen contents between the slider side and the lubrication layer side are formed, and then the layer of the lubricant is formed, the carbon type protective layer having excellent mechanical properties opposes the magnetic recording medium surface. Accordingly, damage to the slider sliding surface, such as a head crash, can be prevented. Moreover, because the adhesion strength between the carbon type protective layer and the lubricant is high, dust of wear and debris hardly occur and even if the debris occurs, it does not adhere to the slider sliding surface.

According to the production method of the magnetic head which irradiates the ultra-violet rays after the lubrication layer is coated on the carbon type protective layer of the magnetic head slider, the chemical bonding power between the carbon type protective film and the lubrication layer can be promoted. Accordingly, the decrease of the film of the lubricant on the core slider surface can be restricted, the lubrication operation can be maintained for a long time, and the occurrence of debris due to the dust can be restricted.

As described above, the present inventor has developed a hydrogen-containing carbon film in order to improve the wear resistance of the magnetic recording medium and as a result, has accomplished an improvement of the wear resistance. According to further studies made by the present inventors, however, it has been found out that the hydrogen-containing carbon film has insufficient insulation resistance for MR head, in some cases.

According to the third aspect of the present invention, in the carbon protective film used for the sliding surface of the recording medium or the magnetic head in a magnetic disk apparatus, a floppy disk apparatus, a magnetic tape apparatus, and so forth, a hydrogen-containing carbon protective film capable of satisfying both high resistance and high hardness can be accomplished and moreover, can be supplied in stable quality.

In the magnetic recording apparatus according to the third aspect of the present invention, the hydrogen content at the lower portion of the film is preferably at least 20% while the hydrogen content at the upper portion is preferably less than 20%.

In other words, in the apparatus according to the present invention, the hydrogen concentration in the carbon protective film is high at the lower initial portion of the protective film. Accordingly, the resistance value becomes high, and a remarkable effect can be obtained in an MR head and in a magnetic disk for the MR head. In contrast, since the hydrogen content is low at the upper portion of the protective film on the surface side, wear resistance at the upper portion of the protective film, the sliding surface, can be improved, and durability can be improved, too. As a result, the carbon film becomes the one that can satisfy both wear resistance and the high resistance. This effect is remarkable particularly when the hydrogen content is at least 20% at the lower portion of the protective film and is less than 20% at the upper portion of the protective film.

When the carbon protective film used for the recording medium of this recording apparatus or for the sliding portion of the magnetic head is formed, this carbon protective film can be formed in such a fashion that it is first formed in a hydrogen-containing atmosphere and the hydrogen concentration in the film becomes high at the lower portion of the protective film as the initial layer and becomes low at the upper portion of the protective film on the surface side by controlling the hydrogen partial pressure.

When the hydrogen partial pressure in the hydrogen-containing atmosphere is controlled, the film can be formed in such a fashion that the hydrogen concentration in the film becomes high at the lower portion Cm1 of the protective film and becomes low at the upper portion Cm2 of the protective film on the surface side.

The hydrogen-containing atmosphere used for forming the carbon protective film is preferably an inert gas atmosphere containing CmHn. In this case, the film is first formed in an CmHn-inert gas atmosphere containing at least 20% of a CmHn quantity so as to form the lower portion Cm1 of the protective film as the initial layer, and then in the CmHn-inert gas atmosphere containing less than 20% of the CmHn quantity so as to form the upper portion Cm2 of the protective film on the surface side. In this way, the carbon protective film having different hydrogen concentrations between the upper and lower portions thereof can be easily produced.

Alternatively, when the carbon protective film described above is formed, the film may be formed first in the CmHn-inert gas atmosphere containing at least 20% of the CmHn quantity to form the lower portion Cm1 of the protective film as the initial layer, and then in the CmHn-inert gas atmosphere containing less than 10 to 20% of CmHn to form the upper portion Cm2 of the protective film on the surface side.

The CmHn-inert gas atmosphere for forming the carbon protective film may be set at an initial stage to a CmHn-inert gas atmosphere containing at least 20% CmHn, and the inert gas can be gradually increased during the formation of the film.

When the CmHn concentration in the CmHn-inert gas atmosphere is changed at the upper and lower portions of the carbon protective film, a carbon film having different hydrogen concentrations at the upper and lower portions thereof can be easily accomplished by setting the CmHn-inert gas atmosphere to the CmHn-inert gas atmosphere containing at least 20% of CmHn at the initial stage, and then gradually increasing the inert gas during the film formation so as to dilute the CmHn.

When the carbon protective film used for the recording medium of the recording apparatus or for the sliding portion of the magnetic head according to the present invention is formed in the CmHn inert gas atmosphere, the film may be formed in the CmHn-inert gas atmosphere containing at least 20% of CmHn to form the lower portion Cm1 of the protective film as the initial layer, and a negative D.C. bias may be applied to the substrate on which the upper portion Cm2 of the protective film on the surface side is to be formed. According to this method, the hydrogen concentration can be changed between the upper and lower portions of the carbon protective film without controlling the CmHn concentration.

The film can be formed at a low temperature by setting the substrate temperature to 150° C. or below when the carbon protective film is formed. According to this method, bonding between the carbon atoms becomes diamond-like, the film strength can be improved, and the film resistance can be increased, too.

When the carbon protective film is formed, it may be formed in the same apparatus as that used for forming the foundation film and the magnetic film, and these films may be left standing for a predetermined time inside an inert gas atmosphere having a high pressure and may be cooled. In this case, the substrate becomes more likely to transfer heat, and the cooling effect can be improved.

It is also possible to form the carbon protective film in a hydrogen-containing atmosphere and to apply a negative D.C. voltage to the substrate side on which the carbon protective film is to be formed. According to this method, film characteristics (Id/Ig) with respect to the hydrogen quantity (hydrogen partial pressure) can be kept at a low and constant level.

Generally, in those carbon films which are formed in an atmosphere having a higher hydrogen partial pressure, the bonding is mostly organic bonding and an increase of Id/Ig (drop of film hardness) is invited. When the negative bias voltage is applied to the substrate in this case, the energy state of the sputter particles is higher and bondability with the substrate can be improved.

For this reason, the carbon film having a higher bondability (diamond property) can be formed, and the change of bonding to organic bonding can be restricted. Accordingly, the carbon protective film having a low Id/Ig ratio can be formed irrespective of the hydrogen partial pressure, and stable production of this protective film becomes possible.

The film resistance tends to increase with the increase of the hydrogen quantity ($CH_4$ quantity) irrespective of the bias voltage. This is because the film resistance depends on the hydrogen quantity in the film, and because the hydrogen quantity in the film depends solely on the film formation atmosphere, so that the high film resistance can be obtained even when a bias voltage is applied. In other words, a protective film having high hardness and high resistance can be accomplished by applying a bias voltage at a high hydrogen partial pressure.

For the reason described above, a hydrogen-containing carbon film having a high hardness can be stably produced irrespective of the fluctuation of the hydrogen partial pressure. Further, fluctuation of the characteristics inside the plane of the magnetic disk can be restricted, and the quality of the carbon film can be improved. Moreover, a protective film having high hardness and high resistance can be accomplished so as to cope with the requirement for the reduction of the thickness of the protective film. As a result, a large capacity and high quality magnetic disk apparatus can be produced.

It is possible to use a CmHn-inert gas as the hydrogen-containing atmosphere, and to form the lower portion of the protective film in a CmHn-inert gas atmosphere containing at least 20% of CmHn. In this way, the hydrogen partial pressure can be easily controlled and the film characteristics (Id/Ig) can be kept at a low and constant level.

Figure 27:
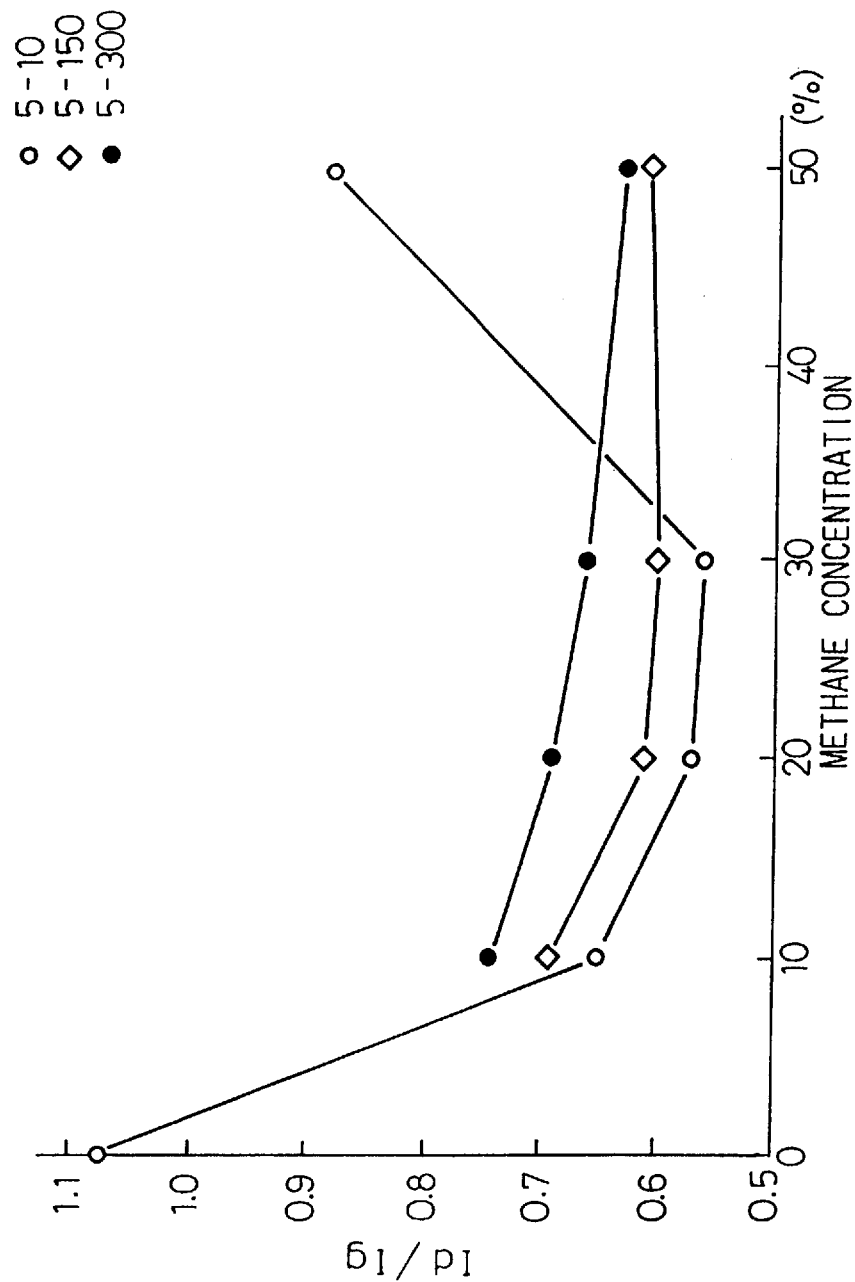
FIG. 27 is a graph showing a Raman ratio obtained by measuring a $CH_4$ concentration and Id/Ig when a substrate temperature is kept at a low temperature.
Figure 28:
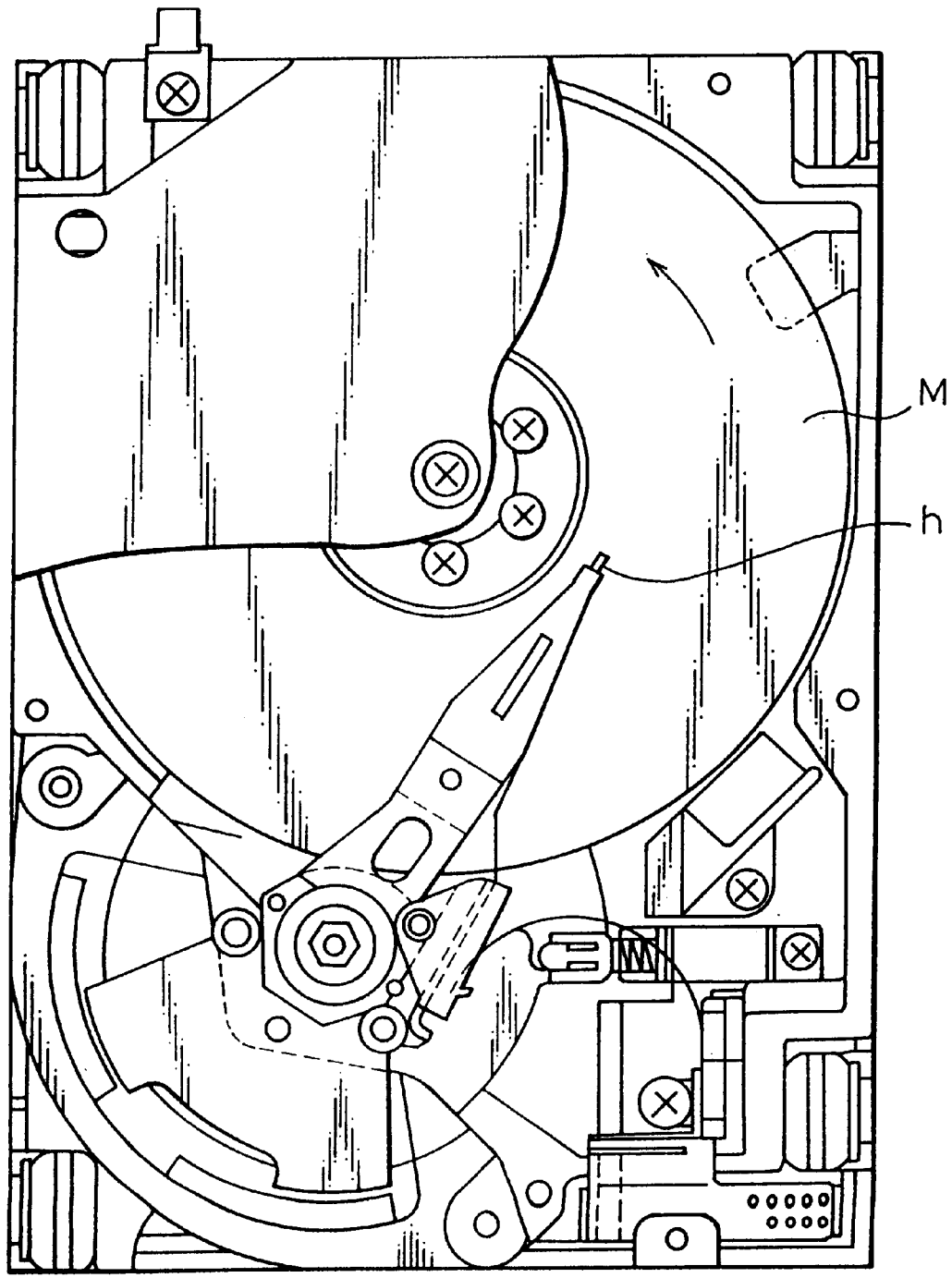
FIG. 28 is a plan view showing the overall structure of the internal structure of a magnetic disk apparatus.
Figure 29:
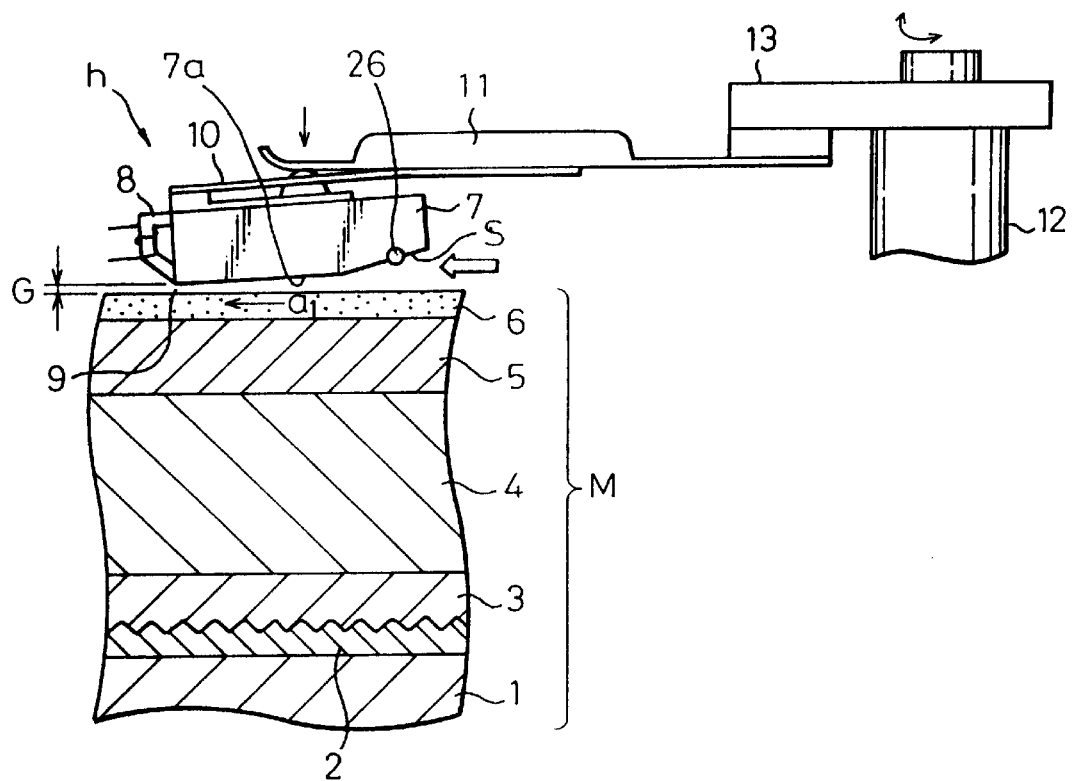
FIG. 29 is an enlarged sectional view of a magnetic disk.
Figure 30A:
FIGS. 30A to 30F are sectional views showing step-wise a process for producing a thin film magnetic disk according to the prior art.
Figure 30B:
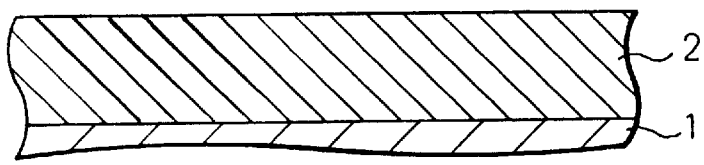
Figure 30C:
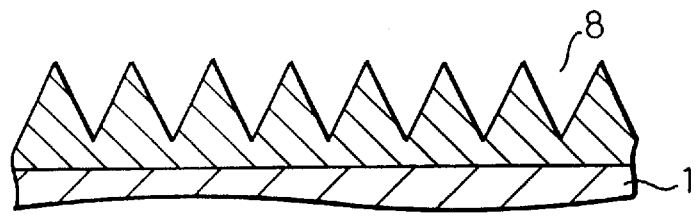
Figure 30D:
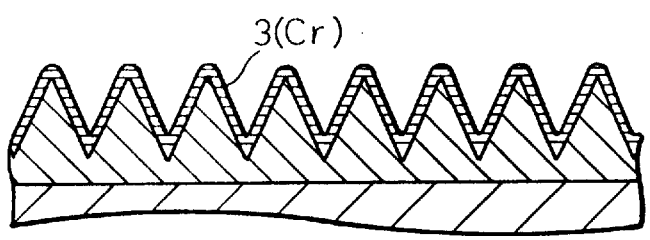
Figure 30E:
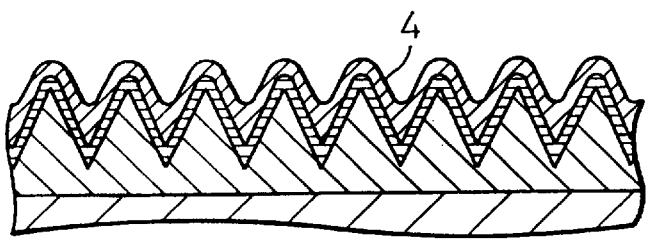
Figure 30F:
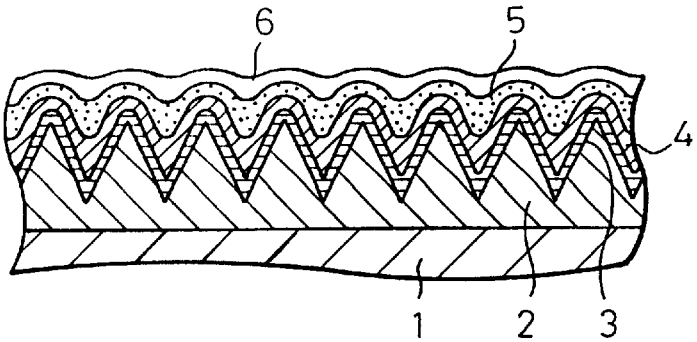

When the substrate bias voltage at the time of the formation of the carbon protective film is kept within the range or −50 to −300 V, an increase in the Id/Ig ratio can be restricted even when the CmHn concentration increases and durability can be improved as shown in FIGS. 22 and 27.

When the carbon protective film is formed in the CmHn-inert gas atmosphere, the power applied to the substrate can be kept constant by reducing the substrate bias voltage while adding more hydrogen. In this way, the effect of the ion assist by the substrate bias can be optimized, and a protective film having high quality can be formed with an arbitrary hydrogen quantity.

When the carbon protective film is formed in the CmHn-inert gas atmosphere, an increase in the Id/Ig ratio can be restricted and durability can be improved by methods other than the application of the substrate bias voltage, such as by reducing the magnetic field in a vertical direction on the target surface while adding more hydrogen.

When the substrate bias voltage is set in the range of −50 to −150 V and the substrate temperature at the time of the formation of the carbon protective film is set to a temperature of not higher than 150° C., the Id/Ig ratio determined by Raman spectroscopy becomes small, the film strength can be improved and moreover, the film resistance becomes high.

When the current value flowing through the substrate side at the time of the application of the substrate bias voltage is limited to below 0.6 A, damage to the resulting carbon protective film can be restricted.

When the substrate bias voltage is applied in the pulse-like form in a predetermined cycle, control of the substrate bias voltage becomes easier.

The wear characteristics of the carbon protective film of the magnetic disk can be made better than those of the carbon protective film of the magnetic head by setting the substrate bias voltage at the time of the formation of the carbon protective film of the magnetic disk to a lower level than the substrate bias voltage at the time of the formation of the carbon protective film of the magnetic head. In this way, the carbon protective film of the magnetic disk can be made thinner, and a medium having excellent recording/reproduction characteristics can be provided.

Because the carbon protective film can be formed inside the same apparatus as the apparatus for forming the foundation film and the magnetic film when the carbon protective film is formed, the film formation apparatus can be used in common. Because the apparatus is left standing in an inert gas atmosphere having a high pressure and is cooled before the formation of the carbon protective film, the substrate is more likely to transfer heat and the cooling effect can be improved, so that the performance of a film made by a low temperature film formation process is improved.

Next, how the carbon protective film for the magnetic disk apparatus according to the present invention and the production method thereof are embodied in practice will be explained with reference to examples.

Example of carbon protective film for magnetic disk apparatus

Figure 16:
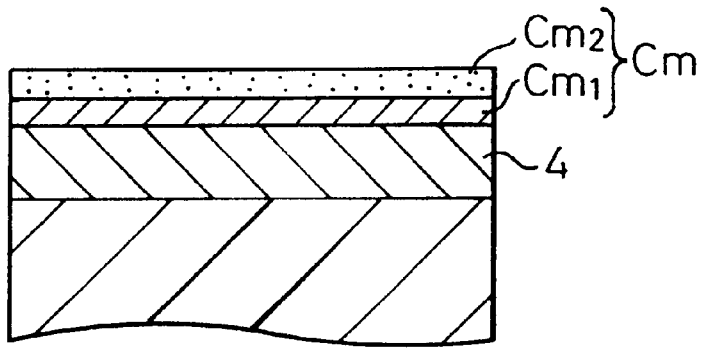
FIG. 16 is a sectional view showing a carbon protective film for a magnetic disk apparatus according to the present invention.

FIG. 16 is a sectional view showing the basic structure of the carbon protective film for the magnetic disk apparatus according to the present invention.

Figure 17:
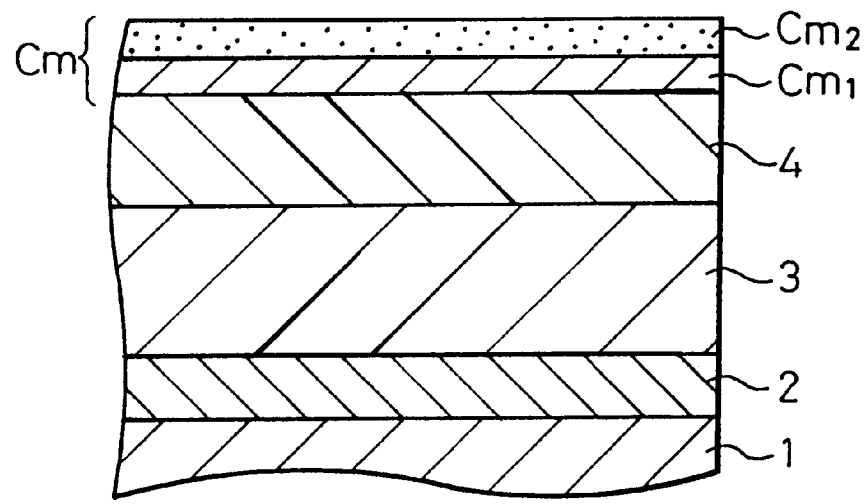
FIG. 17 is a sectional view showing a carbon protective film for a magnetic disk apparatus according to another embodiment of the present invention.

FIG. 17 is a sectional view of the magnetic disk to which the carbon protective film according to the present invention is applied.

A Cr foundation layer 3 and a CoCr system alloy recording layer 4 were deposited, by sputtering, to a film thickness of 500 to 3,000 Å and about 300 to about 500 Å, respectively, on a Ni-P plating layer 2 formed on the surface of a substrate made of a non-magnetic substance such as aluminum. A hydrogen-containing protective film Cm was formed to a thickness of about 100 to 300 Å on the recording layer 4, by sputtering, in a $CH_4$-Ar atmosphere.

Here, the carbon protective film Cm was formed to a thickness of about 100 Å at the initial stage in a $CH_4$-Ar atmosphere containing about 35% of $CH_4$, and then the amount of pure Ar gas in the same atmosphere was increased so that the $CH_4$ amount became about 15%. By the way, the foundation layer 3 and the recording layer 4 were formed at a gas pressure of 5 to 30 mTorr and a substrate temperature of about 150 to about 260° C., and the carbon protective film Cm was formed at a gas pressure of 5 to 30 mTorr and a substrate temperature of about 150 to about 200° C.

As described above, the $CH_4$ gas concentration in the $CH_4$-Ar atmosphere was set to about 35% at the initial stage at which the lower portion of the carbon protective film Cm was formed, and the quantity of the pure Ar gas quantity was increased to make the $CH_4$ quantity about 15% when the upper portion of the protective film was formed. In this way, the hydrogen concentration in the hydrogen-containing carbon protective film became high at the lower portion thereof and low at the upper portion.

When the relationship between the hydrogen concentration and the wear resistance was tested, it was found out that when the hydrogen-to-carbon ratio in the hydrogen-containing carbon protective film was 0.45893, that is, when the hydrogen concentration was too high, the wear resistance was as low as 45.7% and the film was worn by 136 Å, whereas when the hydrogen-to-carbon ratio was 0.38142, the wear resistance could be improved to 75.2% and the wear dropped to 62 Å. Accordingly, it was effective to reduce the hydrogen concentration in the upper portion of the protective film which came into sliding contact with the magnetic head in comparison with the lower portion of the protective film.

Next, the relationship between the hydrogen quantity (hydrogen partial pressure) in the hydrogen-containing carbon protective film and the wear resistance and the resistance value was verified. FIG. 18 shows the experimental results representing the relationship between the hydrogen quantity in the $CH_4$-Ar atmosphere during the film formation and Raman spectroscopy. The abscissa represents the $CH_4$ gas concentration (%) and the abscissa represents Id/Ig as determined by Raman spectroscopy.

Here, the ratio Id/Ig is an index representing bondability of the carbon atom, and it is believed that the smaller this value, the greater becomes the bonding quantity of the diamond-like bonding quantity. In other words, the index suggests that the smaller the Id/Ig value, the higher the hardness and the better the wear characteristics.

According to the experimental results shown in FIG. 18, Id/Ig was small within the range of from about 15 to about 25% of the $CH_4$ gas concentration in the CH/-Ar atmosphere and the film hard was high, but when the $CH_4$ gas concentration was below 15% and above 25%, a drop in the film hardness could be observed.

FIG. 19 shows the experimental results and represents the relationship between the hydrogen quantity in the $CH_4$-Ar atmosphere during film formation and the film resistance value. The abscissa represents the $CH_4$ gas concentration (%) and the ordinate represents the resistance value. As can be clearly seen from the graph, the film resistance increases with an increase in the hydrogen quantity ($CH_4$) in the film. Whereas the film resistance value increased with an increase in the hydrogen quantity, the film hardness dropped when the $CH_4$ quantity exceeded about 25% as can be clearly seen from FIG. 18. It was therefore believed difficult to form the protective film capable of satisfying both high resistance and high wear resistance.

However, according to the present invention, the hydrogen concentration in the carbon protective film is set to a high level at the lower portion of the protective film and to a low level by controlling the hydrogen partial pressure so that the hydrogen concentration becomes high when the lower portion of the protective film is formed and low when the upper portion is formed.

As a result, the wear resistance was low but the resistance value was high at the lower portion of the hydrogen-containing carbon protective film, and the high resistance could be set to a level suitable for the application of the MR head. At the upper portion of the protective film on which the magnetic head came into sliding contact, on the other hand, the resistance value was low but the wear resistance was high. Accordingly, durability could be improved. As described above, the present invention could satisfy both high resistance and high wear resistance by setting the hydrogen concentration in the carbon protective film to be higher at the lower portion of the film than at the upper portion.

By the way, the hydrogen-containing carbon protective film may have a three- more layered structure, and the carbon protective film may have continuously different hydrogen concentrations by gradually changing the film formation condition.

Example of production method for carbon protective film by control of hydrogen concentration As described above, when the hydrogen concentration is changed between the upper and lower sides of the carbon protective film, both high resistance and high wear resistance can be set to optimum values by setting the hydrogen ($CH_4$ gas) concentration of the upper portion to a range in which the wear resistance is the highest and setting the hydrogen ($CH_4$) concentration of the lower portion to a higher level than that of the upper portion.

In other words, when the $CH_4$ quantity in the $CH_4$-Ar atmosphere at the time of the formation of the upper portion of the protective film is set to 10 to 20%, the $CH_4$-Ar quantity in the $CH_4$-Ar atmosphere at the time of formation of the lower portion of the protective film is set to be at least 20%. In this case, because the hydrogen content must be changed between the upper portion and the lower portion of the protective film, the difference of the $CH_4$ quantity is preferably great between when the upper portion is formed and when the lower portion is formed. By the way, the hydrogen quantity can be easily reduced when the upper portion of the protective film is formed in comparison with the lower portion by gradually increasing the amount of Ar gas.

Figure 20A:
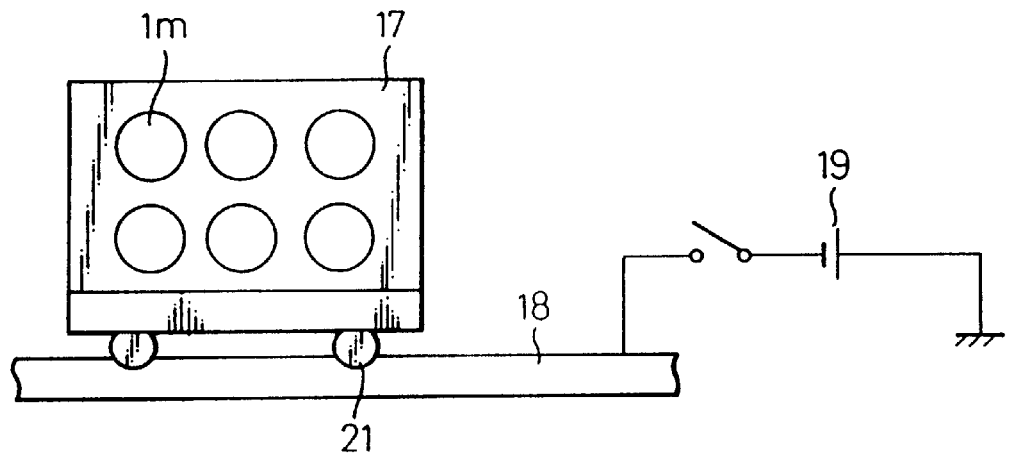
FIGS. 20A and 20B are a side view and a front view showing a film formation apparatus of a hydrogen-containing carbon protective film, respectively.
Figure 20B:
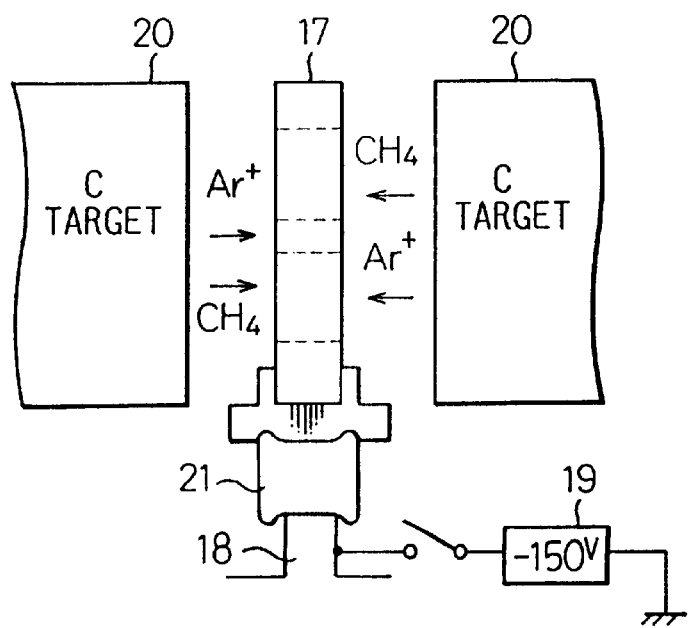

FIGS. 20A and 20B show another embodiment of the method of the present invention, wherein FIG. 20A is a side view of the substrate holder and FIG. 20B is a front view. In this embodiment, a negative D.C. voltage was applied to the substrate side without controlling the $CH_4$ gas concentration in the $CH_4$-Ar atmosphere when the upper portion of the protective film was formed.

In other words, when the carbon protective film was formed by sputtering, the substrate 1m on which the magnetic film was formed was supported by the substrate holder 17, and this substrate holder 17 was caused to run on a metallic rail 18 between carbon targets 20, 20 on both sides. A D.C. power supply 19 was connected to the metallic rail 18.

The lower portion of the protective film was formed in the $CH_4$-Ar atmosphere containing at least 20% of the $CH_4$ quantity. Next, when a negative voltage was applied to the metallic rail 18 at the time of formation of the upper portion of the protective film, the negative voltage was applied to each substrate 1m through metallic wheels 21 and the substrate holder 17. In this way, when the negative bias voltage was applied to the substrate 1m when the film was formed by sputtering, the quantity of hydrogen adhering to the substrate 1m decreased, and substantially the same effect as of lowering the $CH_4$ gas concentration could be obtained.

Accordingly, when the upper portion of the protective film was formed in the hydrogen atmosphere having the same concentration as the concentration used for forming the lower portion of the protective film, it was only necessary to apply the negative D.C. bias to the substrate side at the point of time when a pre-determined film thickness was attained. For this reason, it was not necessary to change the hydrogen partial pressure when both of the carbon protective film portions were formed, and control became simplified.

Additionally, film performance can be improved by setting the substrate temperature at the time of formation of the hydrogen-containing carbon protective film to a low temperature of below about 150° C. In other words, when the film is formed by sputtering at a lower substrate temperature, the Id/Ig ratio becomes smaller, bonding of the carbon atoms becomes diamond-like, and the film strength can be improved. Both film resistance and wear resistance can also be improved. However, when the film formation temperature is low, adhesion between the film and the substrate drops. Therefore, the substrate temperature should be kept within the range in which adhesion can be secured and at the same time, the film strength can be improved.

In order to set the substrate temperature to a low temperature as described above, it is effective to dispose a cooling chamber capable of cooling the substrate before the film formation to the sputtering apparatus, etc. For example, the sputtering apparatus is used in common by forming the carbon protective film inside the same apparatus as the apparatus for forming the foundation film and the magnetic film when the hydrogen-containing carbon protective film is formed.

The apparatus is left standing for a predetermined time in an inert gas atmosphere having a high pressure and is cooled before the carbon protective film is formed. When the pressure of the inert gas is elevated in this way, heat is more easily transferred from the substrate and the cooling effect can be improved.

Figure 21:
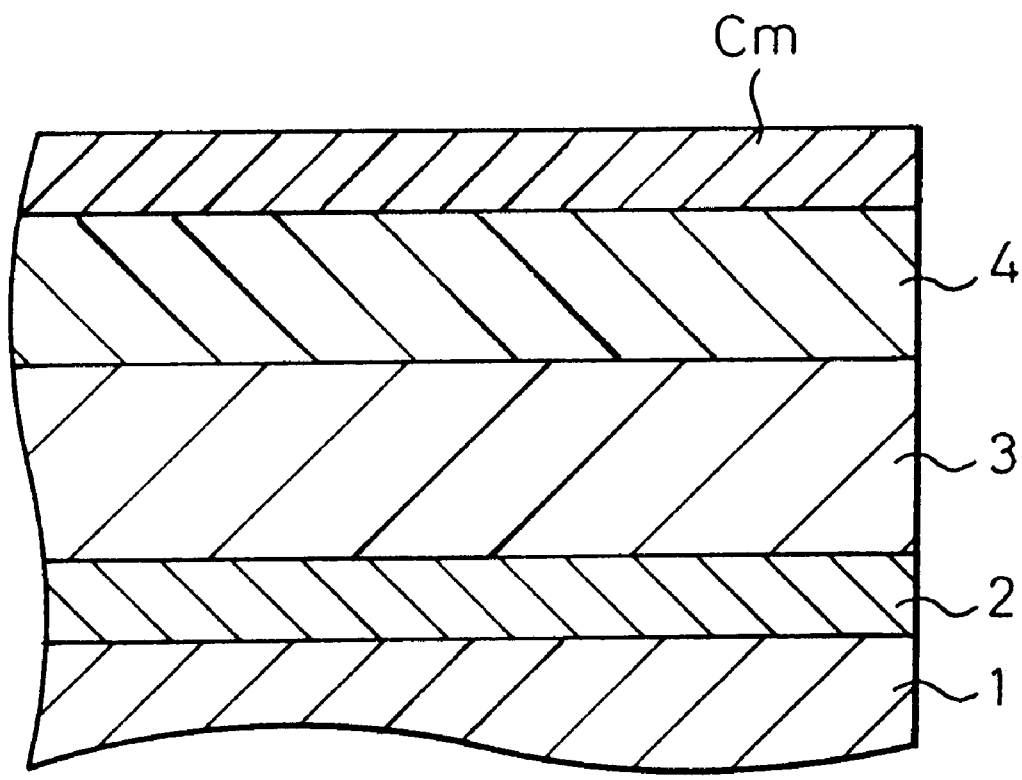
FIG. 21 is a sectional diagram showing a magnetic disk produced by a substrate bias voltage application method.

Example of production method for carbon protective film by application of substrate bias voltage FIG. 21 is a sectional view of the magnetic disk produced by the method of the present invention. A Cr foundation layer 3 and a CoCr system alloy recording layer 4 were formed to a thickness of 500 to 3,000 Å and a thickness of about 300 to about 500 Å, respectively, on a Ni-P plating layer 2 formed on the surface of a non-magnetic substrate 1, by sputtering in an Ar atmosphere. A hydrogen-containing protective film Cm was formed to a thickness of about 100 to about 300 Å on the recording layer 4 by sputtering in the $CH_4$-Ar atmosphere while a D.C. voltage of −50 to −300 V was being applied to the substrate side.

By the way, the foundation layer 3 and the recording layer 4 were formed at a gas pressure of 5 to 30 mTorr and a substrate temperature of 150 to 260° C., and the carbon protective film Cm was formed at a gas pressure of 5 to 30 mTorr and a substrate temperature of from about 150 to about 200° C.

FIG. 22 shows the measurement result of Raman spectroscopy in order to evaluate dependence of the hydrogen-containing carbon protective film formed by the method described above and shown in FIG. 6 on the $CH_4$ quantity and on the bias voltage. The abscissa represents the $CH_4$ concentration (%) in the $CH_4$-Ar atmosphere and the ordinate represents Id/Ig by Raman spectroscopy. The smaller the Id/Ig value, the greater the diamond-like bonding quantity of the carbon atoms, and the higher the hardness, as already described.

When the substrate bias voltage was not applied as shown in FIG. 18, the Id/Ig value increased and the film strength dropped when the $CH_4$ concentration exceeded 20%. In contrast, when the substrate bias voltage was −150 as represented by circle ○ in FIG. 22, or when it was −300 V as represented by a diamond ◇, the Id/Ig value did not increase even when the $CH_4$ gas concentration exceeded 20%.

As described above, even when the $CH_4$ gas concentration exceeded 20%, the Id/Ig value could be kept at a low value of about 0.8 by applying the negative bias voltage to the substrate. Fluctuations in the characteristics of the magnetic disk, depending on the tested portions thereof, were only about 0.05 and were substantially negligible, and excellent results could be obtained in comparison with the conventional value of 0.15.

Figure 23A:
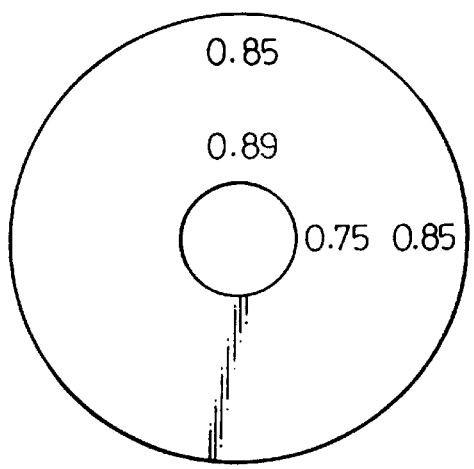
Figure 23B:
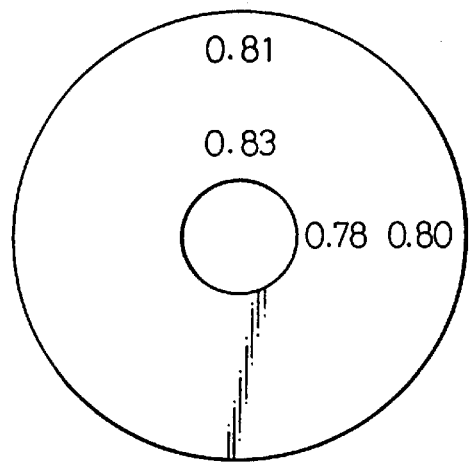

FIGS. 23A and 23B show the results of measurement of characteristic fluctuation on the magnetic disk, wherein FIG. 23A shows a prior art example and FIG. 23B shows an example wherein the substrate bias voltage was applied according to the present invention. When the substrate bias voltage was not applied as in FIG. 23A, the Id/Ig fluctuated between 0.75 and 0.89, whereas in the example of the present invention shown in FIG. 23B wherein the substrate bias voltage was applied, it could be recognized that the fluctuation width was reduced to between 0.78 and 0.83.

FIG. 24 shows the measurement result of the film resistance of the carbon protective film Cm of the magnetic disk shown in FIG. 21. The film resistance did not change much between the case where the substrate bias voltage of −150 V was applied and the case when the substrate bias voltage was not applied as shown in FIG. 19. In other words, it could be understood that the film resistance greatly depended on the $CH_4$ quantity at the time of formation of the film in comparison with the bias voltage. Moreover, the greater the $CH_4$ quantity at the time of formation of the film, the more remarkable became the increase in the film resistance, and it could thus be understood that the protective film formed in an atmosphere with a high hydrogen partial pressure (high $CH_4$ quantity) could accomplish both high hardness and high resistance.

Figure 25:
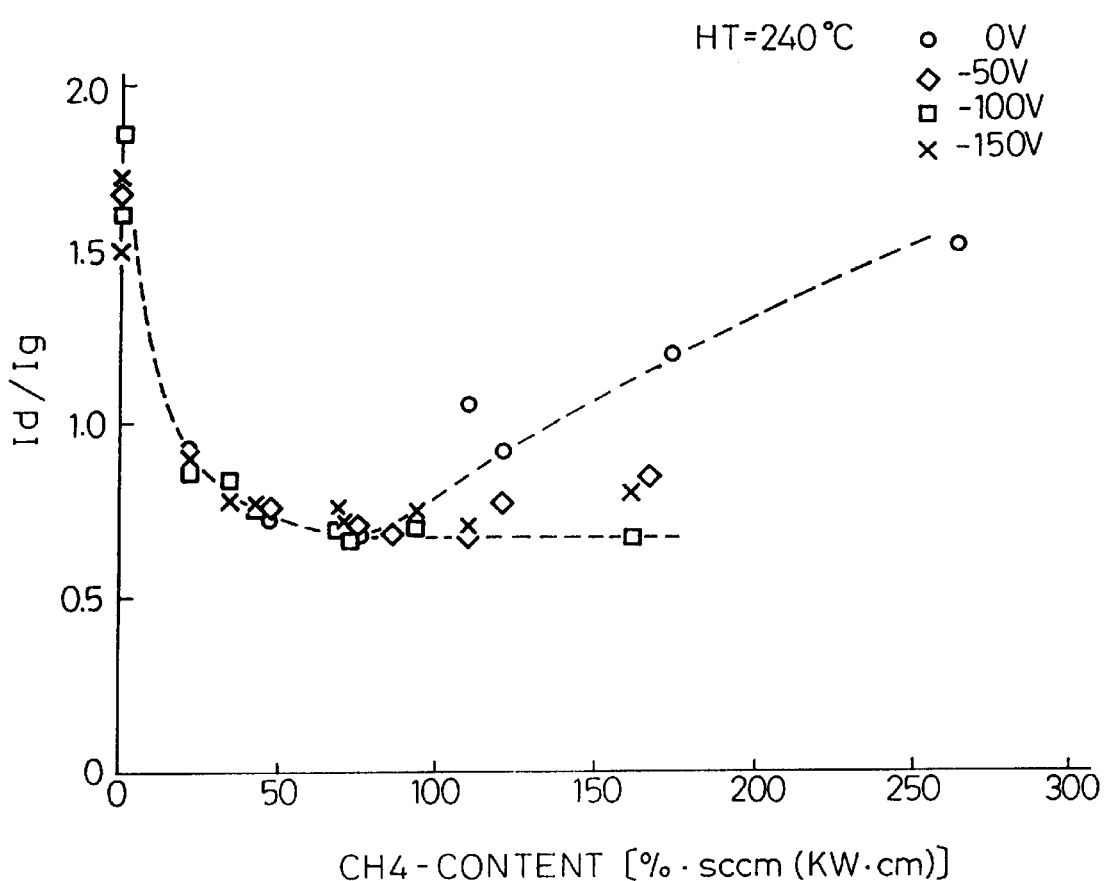
FIG. 25 shows the result of Raman spectroscopy in order to evalue the dependence of Id/Ig on $CH_4$ concentration and bias voltage during production of a hydrogen-containing protective film by the substrate bias voltage application method as in FIG. 22.

FIG. 25 shows also the measurement result of Raman spectroscopy so as to evaluate dependence of the hydrogen-containing carbon protective film on the $CH_4$ quantity and the bias voltage. The graph represents the case where the negative substrate bias voltage was not applied and the case where the substrate bias voltage of −50 to −150 V was applied, by way of example.

As can be seen clearly from the graph, in the case of the circle ○ in which the substrate bias was not applied, Id/Ig increased with a higher $CH_4$ concentration and the film hardness dropped, but when −50 V was applied as represented by the curve with the diamond mark ◇, when −100 V was applied as represented by the curve with the square mark □, and when −150 V was applied as represented by the mark ×, Id/Ig did not increase even when the $CH_4$ concentration increased, and a similar tendency to that of Raman spectroscopy shown in FIG. 22 could be observed.

Accordingly, when the results shown in FIGS. 25 and 22 were collectively examined, the substrate bias voltage was most optimally within the range of −50 to about −300 V, but when the substrate bias voltage was too high, the reverse sputtering effect of the recording layer formed on the substrate side became remarkable. Accordingly, it was not preferred that the substrate bias voltage exceeded about −300 V.

As described above, when the current value flowing through the substrate side was limited to below 0.6 A at the time of the application of the negative substrate bias voltage, damage to the resulting carbon protective film could be restricted. More concrete numerical values were determined in accordance with the voltage at the time of the film formation in combination with the film thickness, but when the current value exceeded 0.6 A, damage to the film became great. Accordingly, it was effective to set the current value to be not greater than 0.6 A.

The negative bias voltage according to the present invention may be applied continuously and may also be applied in a pulse-like form in a predetermined cycle. When the bias voltage is applied in the pulse-like form, control of the application of the substrate bias voltage becomes easier.

Though the description give above explains the case where the hydrogen-containing carbon protective film was formed on the magnetic disk, the present invention can be applied to the formation of the hydrogen-containing protective film on the sliding surface of the magnetic disk. When the hydrogen-containing carbon protective film is formed on both the magnetic disk and the magnetic disk, it is effective to set the substrate bias voltage to a lower level at the time of formation of the carbon protective film of the magnetic disk than at the time of formation of the carbon protective film of the magnetic head.

In this way, the wear characteristics of the carbon protective film of the magnetic disk can be made more excellent than the carbon protective film of the magnetic head, so that the carbon protective film of the magnetic disk can be made thinner, and a medium having excellent recording/reproduction characteristics can be provided.

Figure 26:
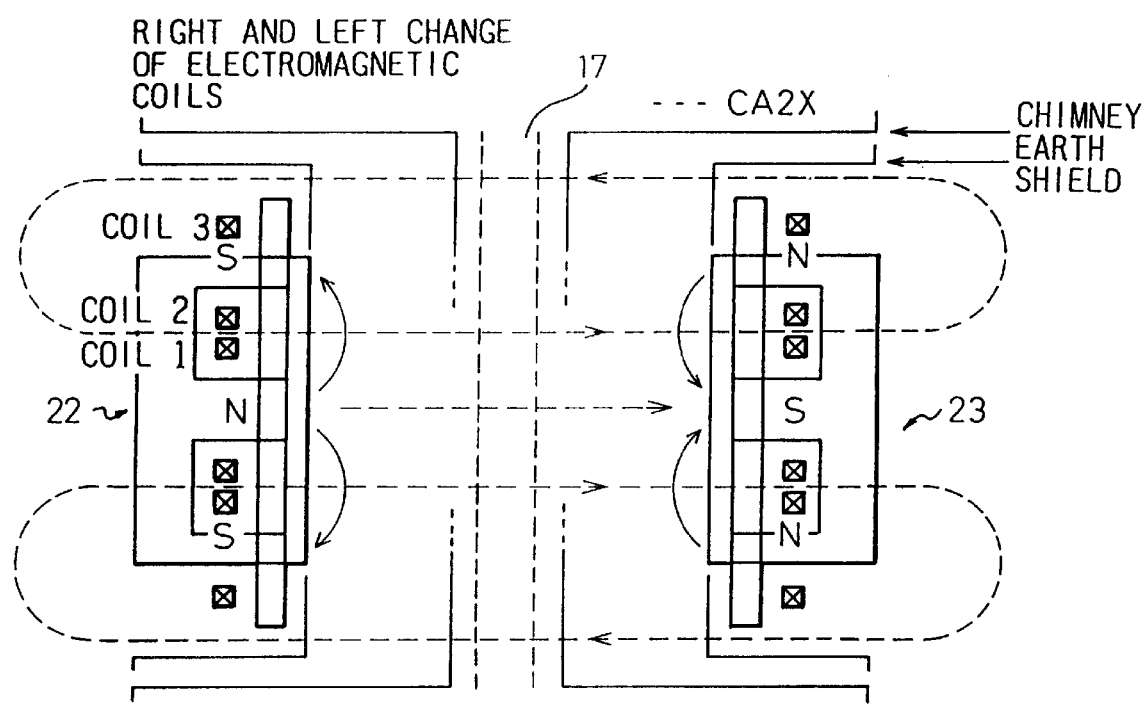
FIG. 26 is a plan view of a sputtering chamber for reducing a magnetic field in a vertical direction.

In order to suppress the increase of Id/Ig, it is also effective to reduce the magnetic field on the target surface in the vertical direction in place of the method of applying the substrate bias voltage. FIG. 26 is a plan view of the inside of the sputter chamber, and electromagnets 22, 23 are disposed on both sides of the substrate holder 17 for holding the substrate on which the carbon protective film is formed.

Each of the electromagnets 22, 23 is equipped with a coil 2, 3 and when the current in the coil 3 is reduced, the vertical magnetic field can be lowered. Usually, the vertical magnetic field has an intensity of some hundreds of Gauss at a current of 20 to 40 A, but when the current value is lowered, while the $CH_4$ quantity is increased, so as to reduce the vertical magnetic field, it has been confirmed that an increase in Id/Ig can be restricted. Definite numerical values must be optimized in accordance with the thickness of the carbon protective film and with the $CH_4$ quantity.

Film performance can be improved by setting the substrate temperature to a temperature of not higher than 150° C. when the carbon protective film is formed by applying a substrate bias of −50 to −150 V in the $CH_4$-Ar atmosphere. In other words, as has been explained with reference to the example of the formation of the carbon protective film by the hydrogen concentration control method, Id/Ig becomes smaller and the film strength can be improved by lowering the substrate temperature and effecting sputtering. Further, both film resistance and wear resistance can be improved.

FIG. 27 shows a Raman ratio determined by measuring the $CH_4$ concentration and Id/Ig when the substrate temperature is 150° C. When the substrate bias voltage is −150 V and what it is −300 V, Id/Ig does not increase but rather decreases even when the $CH_4$ concentration increases beyond 20%. The effect of setting the substrate temperature to a low temperature can be thus confirmed.

To set the substrate temperature to a low temperature as described above, it is effective to provide a sputtering apparatus, etc., with a cooling chamber capable of cooling the substrate before the formation of the protective film. For example, when the hydrogen-containing carbon protective film is formed, the carbon protective film is formed inside the same apparatus as the apparatus for forming the foundation film and the magnetic film, and in this way, the sputtering apparatus is used in common.

The substrate is left standing for a predetermined time in an inert gas atmosphere having a high pressure and is cooled before the carbon protective film is formed. When the pressure of the inert gas is elevated in this way, the substrate can more easily to transfer heat, and the cooling effect can be improved.

$CH_4$ is stable, and the C-H quantity can be easily controlled. Accordingly, each of the foregoing embodiments used the $CH_4$-containing atmosphere as the hydrogen-containing atmosphere when the carbon protective film was formed. However, besides $CH_4$, it is also possible to use $C_2H_2$, $C_2H_4$, $C_2H_6$ and $C_4H_{10}$. Though Ar having high stability was typically shown used in each embodiment as the inert gas constituting the CmHn-inert gas, but the present invention is not particularly limited to Ar. By the way, each of the foregoing embodiments can be as such applied to the case where the hydrogen-containing carbon protective film is formed on the sliding surface of the magnetic head.

Further, in each of the foregoing embodiments, a glass or ceramic substrate may be used in place of aluminum as the non-magnetic substrate 1 for the magnetic disk, and the materials, the film thickness, the formation method, etc., of the foundation layer and the recording layer are not particularly limited to those used in the embodiments so long as they execute the respective functions, and a lubrication layer may also be deposited on the carbon protective film Cm, whenever necessary.

As described above, according to the present invention, when the protective film of the sliding surface of the magnetic disk or the magnetic disk is formed in the hydrogen-containing atmosphere, and the hydrogen concentration is increased in the initial layer. In this way, higher resistance and higher wear resistance can be obtained on the magnetic film side. Accordingly, durability of the magnetic film (inclusive of a magnetic circuit in the case of the magnetic head) can be improved, and the film thickness of the protective film can be reduced to about 200 Å to 300 Å. Accordingly, a higher recording density can be accomplished.

Because the negative D.C. bias voltage is applied to the substrate when the carbon protective film is formed in the hydrogen-containing atmosphere, a protective film having a high hardness can be accomplished stably irrespective of the hydrogen partial pressure. In other words, the quality of each of the magnetic disk and the magnetic head can be stabilized, and the production yield can be improved. Furthermore, a protective film having a higher resistance and a higher hardness can be accomplished in such a manner as to cope with the reduction of the film thickness of the protective film.

What is claimed is:

1. A recording medium comprising:
    a magnetic recording layer for storing information, a carbon protective layer for preventing damage of said magnetic recording layer, and a lubrication layer sequentially formed on a non-magnetic substrate,
    said lubrication layer including a perfluoropolyether having at least one of a hydroxyl group and an aromatic group as a functional group,
    wherein said carbon protective layer consists of a first carbon film having a ratio of hydrogen atoms to carbon atoms (H/C) of at least 16% on a side nearer said magnetic recording layer, and a second carbon film having a ratio of hydrogen atoms to carbon atoms (H/C) of 16% $\geq$H/C<20% on a side nearer said lubrication layer;
    wherein said lubrication layer is irradiated with ultraviolet radiation to enhance the adhesion of said lubrication layer to said carbon protective layer.

2. A recording medium comprising:
    a magnetic recording layer for storing information, a carbon protective layer for preventing damage of said magnetic recording layer, and a lubrication layer sequentially formed on a non-magnetic substrate;
    said lubrication layer including a perfluoropolyether having at least one of a hydroxyl group and a an aromatic group as a functional group;
    wherein a ratio of hydrogen atoms to carbon atoms on a side of said carbon protective layer nearer said magnetic recording layer is at least 16%, and a ratio of hydrogen atoms to carbon atoms (H/C) on a side of said carbon protective layer nearer said lubrication layer is 16% $\geq$H/C<20%;
    wherein said lubrication layer is irradiated with ultraviolet radiation to enhance the adhesion of said lubrication layer to said carbon protective layer.

3. A magnetic head formed by laminating a hydrogen-containing carbon film on at least a sliding surface side of a magnetic head slider having an electromagnetic conversion device mounted thereto and depositing a layer of a lubricant on said hydrogen-containing carbon film, said lubrication layer including a perfluoropolyether having at least one of a hydroxyl group and a an aromatic group as a functional group, wherein said hydrogen-containing carbon film consists of a first carbon film on a side nearer said magnetic head slider having a ratio of hydrogen atoms to carbon atoms of at least 16%, and a second carbon film on a side nearer said lubrication layer having a ratio of hydrogen atoms to carbon atoms (H/C) of 16% ≧H/C<20%, and wherein said lubrication layer is irradiated with ultraviolet radiation to enhance the adhesion of said lubrication layer to said carbon protective layer.

4. A magnetic head formed by laminating a hydrogen-containing carbon film on at least a sliding surface side of a magnetic head slider having an electromagnetic conversion device mounted thereto and depositing a layer of a lubricant on said hydrogen-containing carbon film, said lubrication layer including a perfluoropolyether having at least one of a hydroxyl group and a an aromatic group as a functional group, wherein said hydrogen-containing carbon film is continuously formed so that a ratio of hydrogen atoms to carbon atoms (H/C) gradually changes from at least 16% on a side nearer said magnetic head slider to 16% ≧H/C<20%, and wherein said lubrication layer is irradiated with ultraviolet radiation to enhance the adhesion of said lubrication layer to said carbon protective layer on a side nearer said lubrication layer.

* * * * *

UNITED STATES PATENT AND TRADEMARK OFFICE
CERTIFICATE OF CORRECTION

PATENT NO.   : 6,132,875
DATED        : October 17, 2000
INVENTOR(S)  : Kiuchi et al.

It is certified that error appears in the above-identified patent and that said Letters Patent is hereby corrected as shown below:

<u>Column 28,</u>
Line 43, delete "$16\% \geq H/C < 20\%$" and insert -- $16\% \leq H/C < 20\%$ -- therefor.
Line 62, delete "$16\% \geq H/C < 20\%$" and insert -- $16\% \leq H/C < 20\%$ -- therefor.

<u>Column 29,</u>
Line 12, delete "$16\% \geq H/C < 20\%$" and insert -- $16\% \leq H/C < 20\%$ -- therefor.

<u>Column 30,</u>
Line 12, delete "$16\% \geq H/C < 20\%$" and insert -- $16\% \leq H/C < 20\%$ -- therefor.

Signed and Sealed this

Twenty-fifth Day of September, 2001

Attest:

*Nicholas P. Godici*

NICHOLAS P. GODICI
*Attesting Officer*     Acting Director of the United States Patent and Trademark Office

UNITED STATES PATENT AND TRADEMARK OFFICE
CERTIFICATE OF CORRECTION

PATENT NO.    : 6,132,875
DATED         : October 17, 2000
INVENTOR(S)   : Kiuchi et al.

It is certified that error appears in the above-identified patent and that said Letters Patent is hereby corrected as shown below:

Title page,
Under "References Cited - Other Publications":

First listed reference, delete "Irrodiation" and insert -- Irradiation -- therefor.

Second listed reference, delete "Surfacce" and insert -- Surface -- therefor.

Column 4,
Line 1, delete "minaturization" and insert -- miniaturization -- therefor.
Line 12, delete the comma after "debris".

Column 28,
Line 2, delete "16% $\leq$ H/C < 20% and insert -- 16% $\geq$ H/C < 20% -- therefor.
Line 43, delete "16% $\leq$ H/C < 20% and insert -- 16% $\geq$ H/C < 20% -- therefor.
Line 55, after "and" delete "a".

Column 29,
Line 5, after "and" delete "a".
Line 12, delete "16% $\leq$ H/C < 20% and insert -- 16% $\geq$ H/C < 20% -- therefor.

Column 30,
Line 6, after 'and" delete "a".
Line 12, delete "16% $\leq$ H/C < 20% and insert -- 16% $\geq$ H/C < 20% -- therefor.

Signed and Sealed this

Sixth Day of November, 2001

Attest:

NICHOLAS P. GODICI
*Attesting Officer*    *Acting Director of the United States Patent and Trademark Office*